US012418606B2

(12) United States Patent
Lee et al.

(10) Patent No.: US 12,418,606 B2
(45) Date of Patent: Sep. 16, 2025

(54) ELECTRONIC DEVICE COMPRISING DISPLAY MODULE

(71) Applicant: Samsung Electronics Co., Ltd., Suwon-si (KR)

(72) Inventors: Chulhwan Lee, Suwon-si (KR); Sunghun Kim, Suwon-si (KR); Woonbae Kim, Suwon-si (KR); Younghoon Lee, Suwon-si (KR); Hyunggeun Lee, Suwon-si (KR); Hyungseok Lim, Suwon-si (KR); Jaewon Yu, Suwon-si (KR); Howon Lee, Suwon-si (KR); Sungkyu Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 299 days.

(21) Appl. No.: 18/182,057

(22) Filed: Mar. 10, 2023

(65) Prior Publication Data
US 2023/0239388 A1 Jul. 27, 2023

Related U.S. Application Data

(63) Continuation of application No. PCT/KR2021/012756, filed on Sep. 17, 2021.

(30) Foreign Application Priority Data

Sep. 22, 2020 (KR) .................. 10-2020-0122541
Dec. 22, 2020 (KR) .................. 10-2020-0181078

(51) Int. Cl.
H05K 1/18 (2006.01)
H04M 1/02 (2006.01)
H04M 1/18 (2006.01)

(52) U.S. Cl.
CPC ......... *H04M 1/185* (2013.01); *H04M 1/0266* (2013.01); *H04M 1/0277* (2013.01); *H05K 1/189* (2013.01); *H05K 2201/10128* (2013.01)

(58) Field of Classification Search
CPC .. H04M 1/185; H04M 1/0266; H04M 1/0277; H05K 1/189
(Continued)

(56) References Cited

U.S. PATENT DOCUMENTS 8,492,969 B2 * 7/2013 Lee ...................... H05B 33/04
                                              313/504
2013/0286601 A1 10/2013 Shin et al.
(Continued)

FOREIGN PATENT DOCUMENTS

KR 10-2013-0102812 A 9/2013
KR 10-2013-0121297 11/2013
(Continued)

OTHER PUBLICATIONS

Korean Office Action dated Mar. 19, 2025, issued in Korean Application No. 10-2020-0181078.

Primary Examiner — Binh B Tran
(74) Attorney, Agent, or Firm — Jefferson IP Law, LLP

(57) ABSTRACT

An electronic device is provided. The electronic device includes a housing and a display including a transparent plate forming a front of the electronic device, a display panel viewable from the front of the electronic device through the transparent plate, a panel flexible circuit film arranged under the rear surface of the display panel including a bending part that extends toward the front surface of the display panel in a region adjacent to a first side surface of the electronic device, the bending part being electrically connected to the display panel on the front surface of the display panel, and a first support member arranged between the rear surface of the display panel and the panel flexible circuit film, a partial (Continued)

region of the first support member having an area larger than that of the panel flexible circuit film within a designated distance from the first side surface.

14 Claims, 18 Drawing Sheets

(58) Field of Classification Search
USPC .................................................. 361/679.01
See application file for complete search history.

(56) References Cited

U.S. PATENT DOCUMENTS

| | | | |
|---|---|---|---|
| 2019/0103448 A1 | 4/2019 | Cho et al. | |
| 2019/0380197 A1 | 12/2019 | Lee et al. | |
| 2020/0192431 A1* | 6/2020 | Shin | G06F 1/1626 |
| 2020/0192433 A1 | 6/2020 | Shin et al. | |
| 2020/0196496 A1 | 6/2020 | Shin | |
| 2020/0209925 A1 | 7/2020 | Paek et al. | |
| 2020/0274098 A1 | 8/2020 | Shin et al. | |
| 2022/0208107 A1* | 6/2022 | Kim | G09G 3/3266 |

FOREIGN PATENT DOCUMENTS

| | | |
|---|---|---|
| KR | 10-2018-0014446 A | 2/2018 |
| KR | 10-2019-0037903 | 4/2019 |
| KR | 10-2019-0081049 A | 7/2019 |
| KR | 10-2019-0139352 | 12/2019 |
| KR | 10-2020-0049321 A | 5/2020 |
| KR | 10-2020-0072852 A | 6/2020 |
| KR | 10-2020-0073083 | 6/2020 |
| KR | 10-2020-0073085 | 6/2020 |
| KR | 10-2020-0073086 A | 6/2020 |
| KR | 10-2020-0082363 A | 7/2020 |
| KR | 10-2020-0103240 | 9/2020 |

* cited by examiner

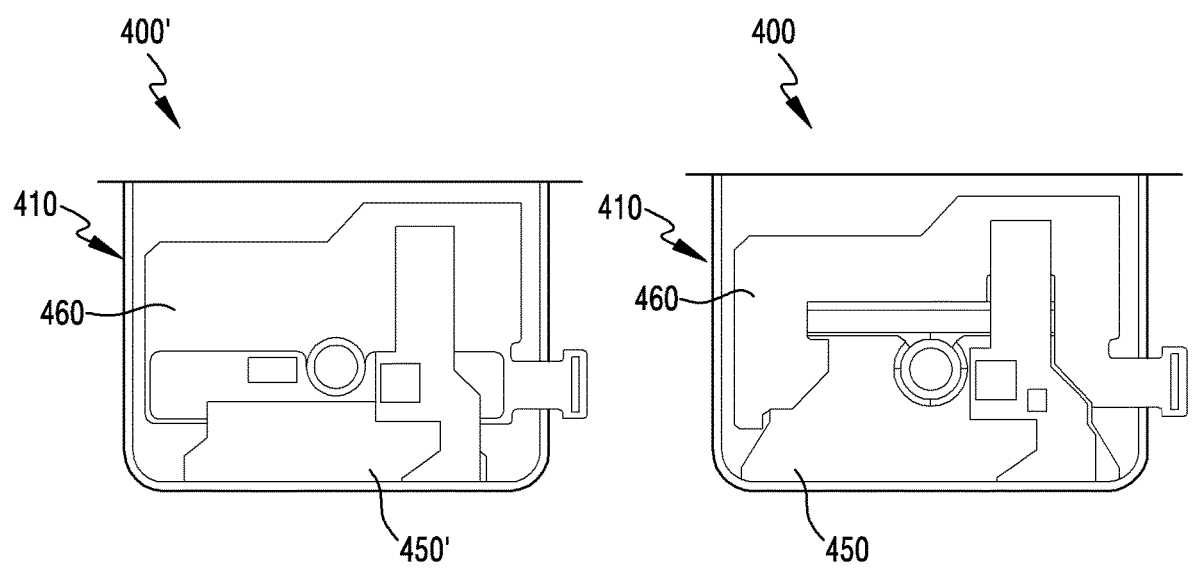

ELECTRONIC DEVICE COMPRISING DISPLAY MODULE

CROSS-REFERENCE TO RELATED APPLICATION(S)

This application is a continuation application, claiming priority under § 365(c), of an International application No. PCT/KR2021/012756, filed on Sep. 17, 2021, which is based on and claims the benefit of a Korean patent application number 10-2020-0122541, filed on Sep. 22, 2020, in the Korean Intellectual Property Office, and of a Korean patent application number 10-2020-0181078, filed on Dec. 22, 2020, in the Korean Intellectual Property Office, the disclosure of each of which is incorporated by reference herein in its entirety.

BACKGROUND

1. Field

The disclosure relates to a display module structure including a member that supports a chip-on-film (COF) and an electronic device including the display module structure.

2. Description of Related Art

Portable electronic devices (hereinafter, referred to as electronic devices) such as smart phones and tablet personal computers (PCs) may include a display module for displaying images. The display module may be manufactured by stacking a plurality of layers such as a display panel, a transparent plate, a cover panel, and the like in a manufacturing process and includes a display diver IC (DDI) and/or a chip-on-film (COF) configured to control the display module.

In an electronic device, gaps (or empty spaces) may occur between respective components of the electronic device in process of manufacturing the electronic device. However, due to the gaps existing inside the display module or around the display module, when the electronic devices are dropped, the display module may receive a stronger impact, which may cause cracks in the display module.

The above information is presented as background information only to assist with an understanding of the disclosure. No determination has been made, and no assertion is made, as to whether any of the above might be applicable as prior art with regard to the disclosure.

SUMMARY

Recently, as the demand for high-performance display modules increases, a display module using a display diver IC (DDI) supporting an operating frequency of 120 hertz (Hz) or an electronic device to which the display module is applied is being released. In the case of the electronic device to which the 120 Hz DDI is applied, the size of a COF inevitably increases as the number of wires and/or packet assemblers/disassemblers (PADs) increases compared to that of a conventional electronic device to which a 60 Hz DDI is applied.

In the case of an electronic device to which an extended COF is applied, when the electronic device is dropped, cracks may more easily occur in the display module due to the gaps existing inside the electronic device (particularly, at the corners inside the electronic device).

Aspects of the disclosure are to address at least the above-mentioned problems and/or disadvantages and to provide at least the advantages described below. Accordingly, an aspect of the disclosure is to provide an electronic device in which at least one support member configured to compensate for a gap and/or a step occurring inside the display module of the electronic device is disposed so that a display module can be suppressed from being damaged due to drop impact.

Additional aspects will be set forth in part in the description which follows and, in part, will be apparent from the description, or may be learned by practice of the presented embodiments.

In accordance with an aspect of the disclosure, an electronic device is provided. The electronic device includes a housing defining at least a portion of an exterior of the electronic device, and a display seated on the housing. The display includes a transparent plate defining at least a portion of the front surface of the electronic device, a display panel at least partially visually recognized from the front surface of the electronic device through the transparent plate, a panel flexible circuit film including a bending portion disposed under the rear surface of the display panel and extending toward the front surface of the display panel in an area adjacent to a first side surface of the electronic device, wherein the bending portion is electrically connected to the display panel on the front surface of the display panel, and a first support member disposed between the rear surface of the display panel and the panel flexible circuit film. At least a partial area of the first support member may have an area larger than the area of the panel flexible circuit film within a predetermined distance from the first side surface.

In accordance with another aspect of the disclosure, an electronic device is provided. The electronic device includes a display panel, a panel flexible circuit film including a bending portion disposed under the rear surface of the display panel and extending toward the front surface of the display panel in an area adjacent to a first side surface of the electronic device, wherein the bending portion is electrically connected to the display panel on the front surface of the display panel, and a first support member disposed between the rear surface of the display panel and the panel flexible circuit film. At least the partial area of the first support member may be exposed outside the panel flexible circuit film when the display is viewed from the rear surface of the display.

In the electronic device according to various embodiments of the disclosure, by extending the area of the support member disposed between the rear surface of the display panel and the panel flexible circuit film to the corners of the electronic device, it is possible to reduce empty spaces occurring inside the electronic device, and it is possible to suppress the occurrence of cracks in the display due to a drop impact.

In the electronic device according to various embodiments of the disclosure, by additionally disposing the support member configured to compensate for a step (or an empty space) occurring by a panel flexible circuit film on the display to reduce an empty space occurring inside the electronic device, it is possible to suppress cracks from occurring in the display due to a drop impact.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 5A and 5B are plan views illustrating, in comparison, internal arrangement structures of a display module according to a comparative embodiment and a display module according to various embodiments of the disclosure;

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
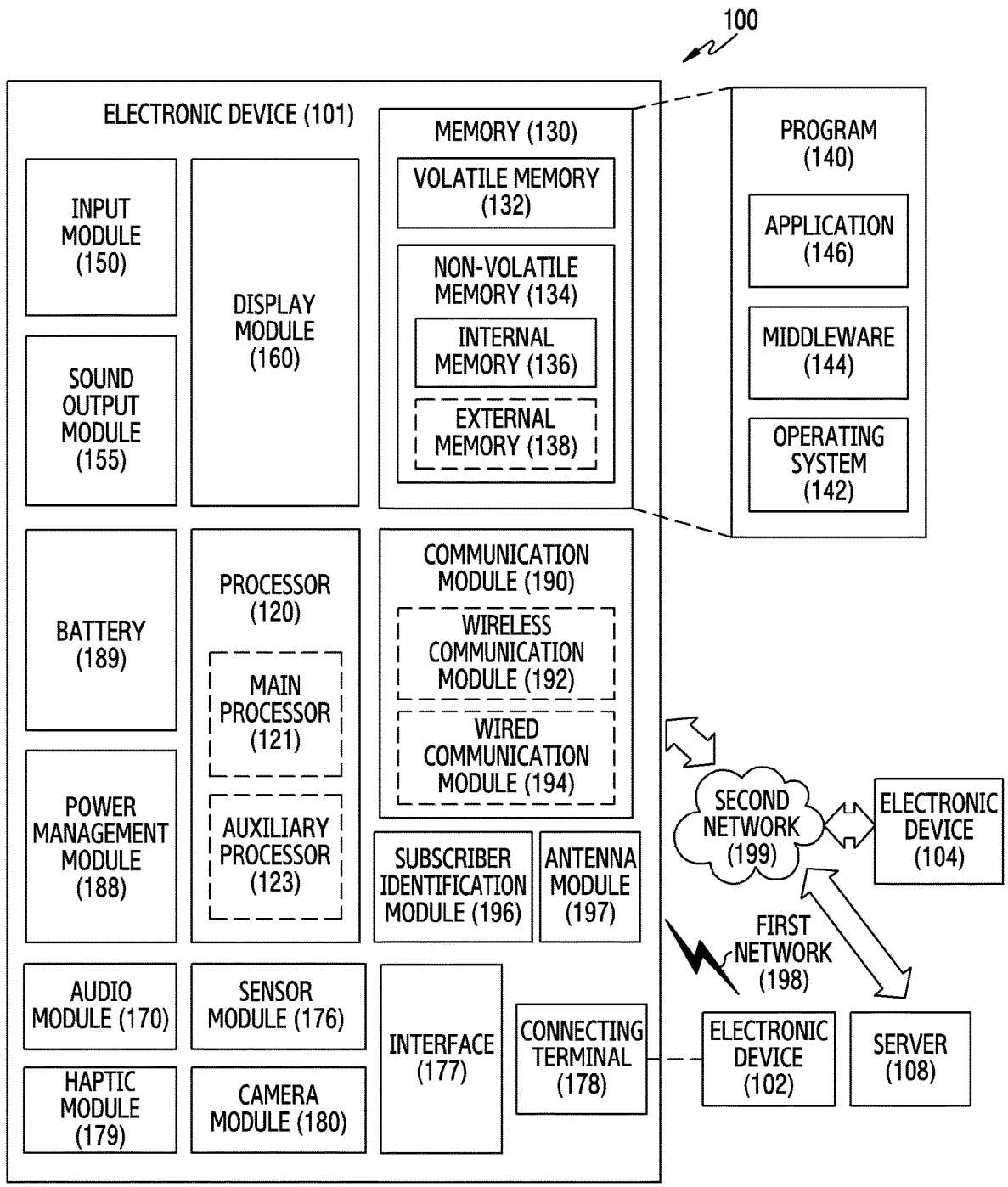
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101.

The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., the electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

The connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 gigabits per second (Gbps) or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form an mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102 and 104 or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st," and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it denotes that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply denotes that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
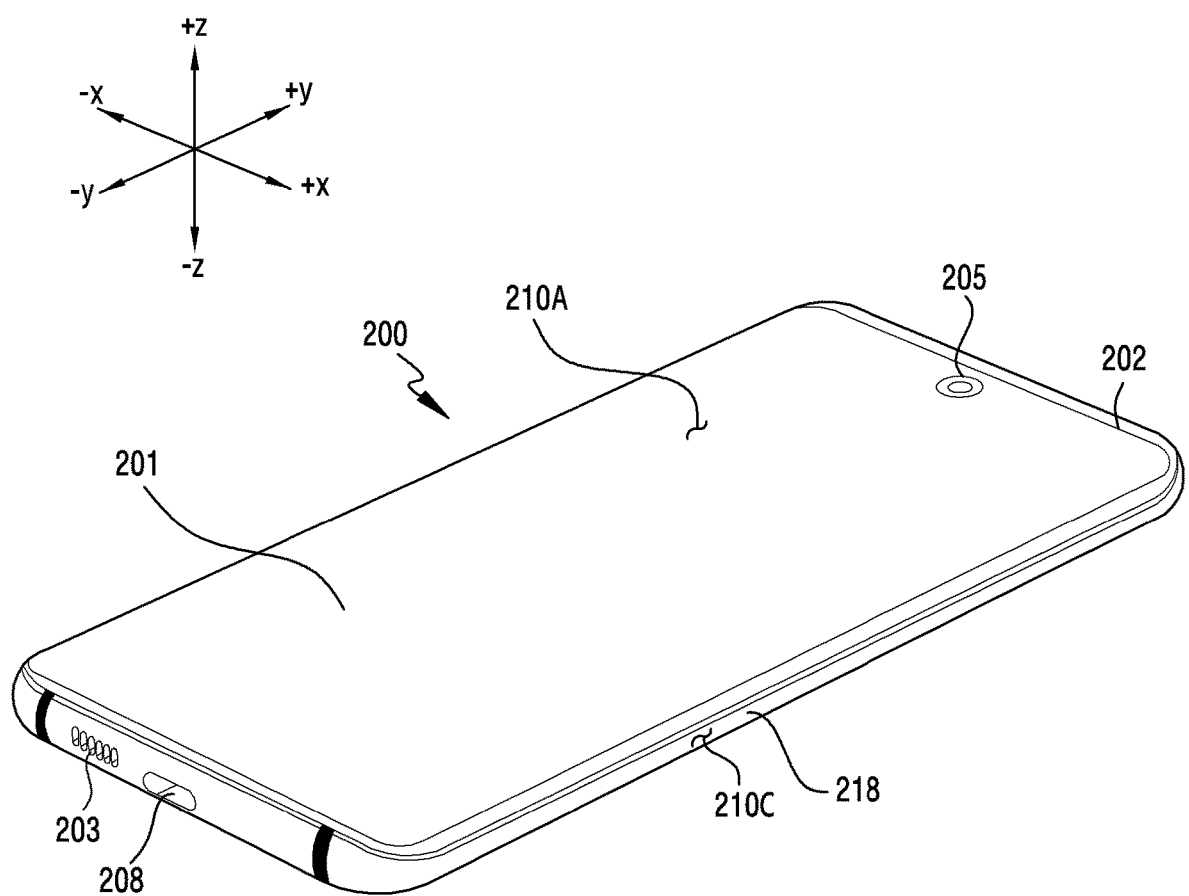
FIG. 2A is a front perspective view of an electronic device according to an embodiment of the disclosure.
Figure 2B:
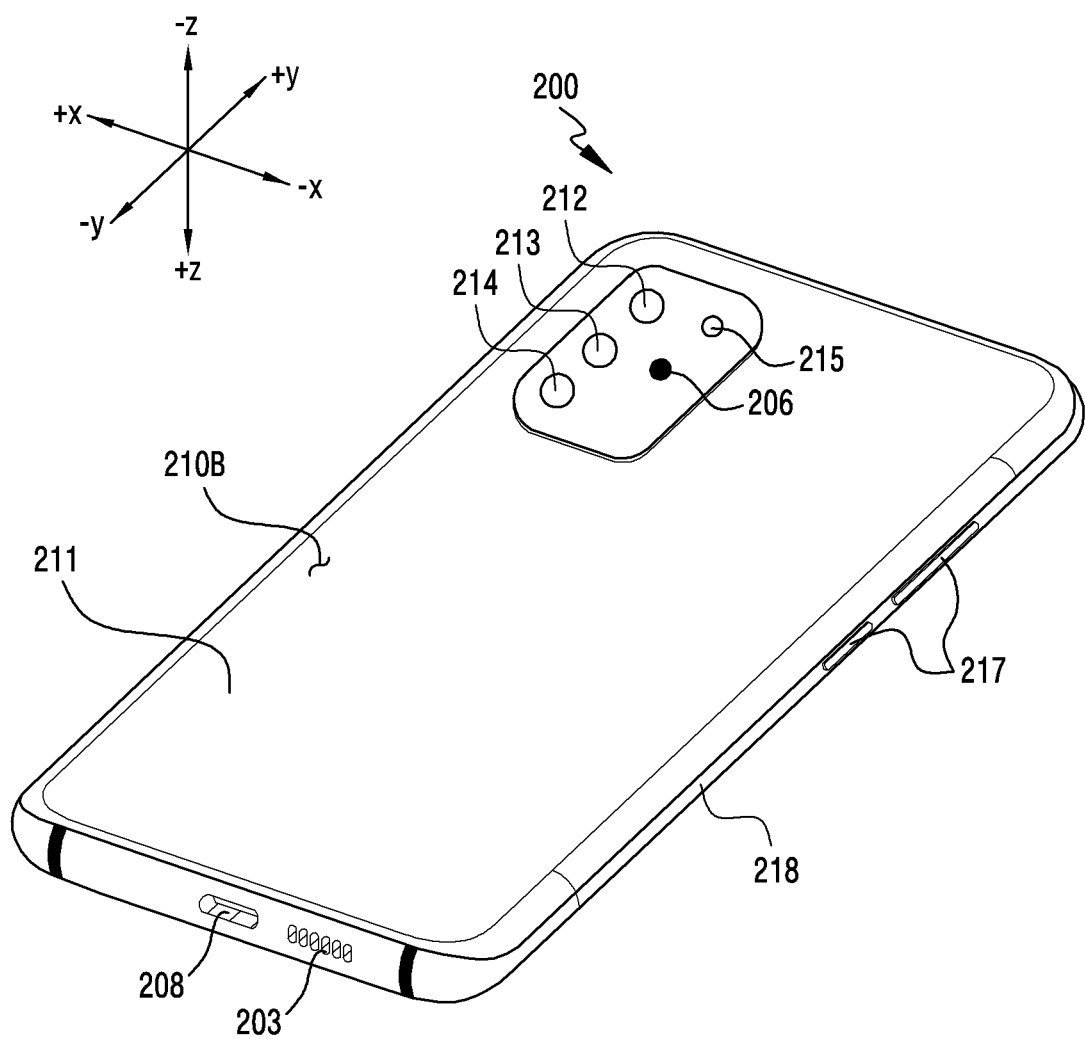
FIG. 2B is a rear perspective view of the electronic device of FIG. 2A according to an embodiment of the disclosure.

FIG. 2A is a front perspective view of an electronic device according to an embodiment of the disclosure, and FIG. 2B is a rear perspective view of the electronic device of FIG. 2A according to an embodiment of the disclosure.

Referring to FIGS. 2A and 2B, an electronic device 200 (e.g., the electronic device 101 in FIG. 1) according to an embodiment may include a housing 210 including a first surface (or a "front surface) 210A, a second surface (or a "rear surface") 210B, and a side surface (a "side wall") 210C surrounding the space between the first surface 210A and the second surface 210B. In another embodiment (not illustrated), the term "housing 210" may refer to a structure defining a portion of the first surface 210A, the second surface 210B, and the side surface 210C of FIGS. 2A and 2B.

According to an embodiment, the first surface 210A may be at least partially defined by a substantially transparent front surface plate 202 (e.g., a glass plate or a polymer plate including various coating layers). According to an embodiment, the front surface plate 202 may include a curved portion bent and seamlessly extending from the first surface 210A toward a rear surface plate 211 in at least one side edge portion.

According to an embodiment, the second surface 210B may be defined by a substantially opaque rear surface plate 211. The rear surface plate 211 may be made of, for example, coated or colored glass, ceramic, polymer, or metal (e.g., aluminum, stainless steel (STS), or magnesium), or a combination of two or more of these materials. According to an embodiment, the rear surface plate 211 may include a curved portion bent and extending seamlessly from the second surface 210B toward the front surface plate 202 in at least one side edge portion.

According to an embodiment, the side surface 210C may be defined by a side surface member (or a "bracket") 218 coupled to the front surface plate 202 and the rear surface plate 211 and including metal and/or polymer. In some embodiments, the rear surface plate 211 and the side surface member 218 may be integrally configured and may include the same material (e.g., a metal material such as aluminum).

According to an embodiment, the electronic device 200 may include at least one of a display 201, an audio module 203, a sensor module (not illustrated), camera modules 205, 212, 213, and 206, key input devices 217, and a connector hole 208. In some embodiments, in the electronic device 200, at least one of the components (e.g., the key input devices 217) may be omitted, or other components may be additionally included. In some embodiments, the electronic device 200 may include a sensor module (not illustrated). For example, the sensor module may be disposed on the rear surface of a screen display area of the display 201 that is visible to the outside of the electronic device 200 through the front surface plate 202. For example, at least one of an optical sensor, an ultrasonic sensor, or a capacitive sensor may be disposed on the rear surface of the screen display area of the display 201, but the disclosure is not limited thereto. In some embodiments, the electronic device 200 may further include a light-emitting element, and the light-emitting element may be disposed at a position adjacent to the display 201 in the area provided by the front surface plate 202. The light-emitting element may provide, for example, the state information of the electronic device 200 in an optical form. In another embodiment, the light-emitting element may provide, for example, a light source that is interlocked with the operation of the camera module 205. The light-emitting element may include, for example, an LED, an IR LED, and/or a xenon lamp.

The display 201 may be visible to the outside of the electronic device 200 through, for example, a substantial portion of the front surface plate 202. In an embodiment, the edges of the display 201 may be provided to be substantially the same as the outer peripheral shape (e.g., a curved surface) of the front surface plate 202 adjacent thereto.

In another embodiment (not illustrated), the electronic device 200 may include a recess, a notch, or an opening in a portion of the screen display area of the display 201, and may include other electronic components aligned with the recess, notch, or opening, such as the camera module 205 or a sensor module (not illustrated). In another embodiment (not illustrated), the rear surface of the screen display area of the display 201 may include at least one of the camera modules 212, 213, 214, and 215, a fingerprint sensor, and a flash (e.g., camera module 206). In another embodiment (not illustrated), the display 201 may be coupled to or disposed adjacent to a touch-sensitive circuit, a pressure sensor capable of measuring a touch intensity (pressure), and/or a digitizer configured to detect an electromagnetic field-type stylus pen.

The audio module 203 may include a microphone hole and a speaker hole. The microphone hole may include a microphone disposed therein to acquire external sound. In some embodiments, multiple microphones may be disposed in the microphone hole to detect the direction of sound. In some embodiments, the speaker hole and the microphone hole may be implemented as a single hole, or a speaker may be included without a speaker hole (e.g., a piezo speaker). The speaker hole may include an external speaker hole and a call receiver hole.

By including a sensor module (not illustrated), the electronic device 200 may generate an electrical signal or data value corresponding to an internal operating state or an external environmental condition. The sensor module may further include, for example, a proximity sensor disposed on the first surface 210A of the housing 210, a fingerprint sensor disposed on the rear surface of the display 201, and/or a biometric sensor (e.g., an HRM sensor) disposed on the second surface 210B of the housing 210. The electronic device 200 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205, 212, 213, 214, 215, and 206 may include a first camera device (e.g., camera module 205) disposed on the first surface 210A of the electronic device 200, and second camera devices (e.g., camera modules 212, 213, 214, and 215) and/or a flash (e.g., camera module 206) disposed on the second surface 210B thereof. The above-described camera modules 205, 212, 213, 214, and 215 may include one or more lenses, an image sensor, and/or an image signal processor. The flash (e.g., camera module 206) may include, for example, a light-emitting diode or a xenon lamp. In some embodiments, two or more lenses (e.g., an infrared camera lens, a wide-angle lens, and a telephoto lens) and image sensors may be disposed on one surface of the electronic device 200.

The key input devices 217 may be disposed on the side surface 210C of the housing 210. In another embodiment, the electronic device 200 may not include some or all of the above-mentioned key input devices 217, and the key input devices 217, which are not included in the electronic device 200, may be implemented in another form, such as soft keys, on the display 201. In some embodiments, the key input devices may include at least a portion of a fingerprint sensor disposed on the second surface 210B of the housing 210.

The connector hole 208 may accommodate a connector configured to transmit and receive power and/or data to and from an external electronic device and a connector configured to transmit and receive an audio signal to and from an external electronic device. For example, the connector hole 208 may include a USB connector or an earphone jack. In an embodiment, the USB connector and the earphone jack may be implemented as a single hole (e.g., the connector hole 208 in FIGS. 2A and 2B), and according to another embodiment (not illustrated), the electronic device 200 may transmit and receive power and/or data or transmit and receive an audio signal to and from an external electronic device (e.g., the electronic devices 102 and 104 in FIG. 1) without a separate connector hole.

In the disclosure, the surface in the +z direction of FIGS. 2A and 2B will be referred to as the front surface, the surface in the −z direction of FIGS. 2A and 2B will be referred to as the rear surface, the end in the +y direction of FIGS. 2A and 2B will be referred to as the upper end, and the end in the −y direction of FIGS. 2A and 2B will be referred to as a lower end.

Figure 3:
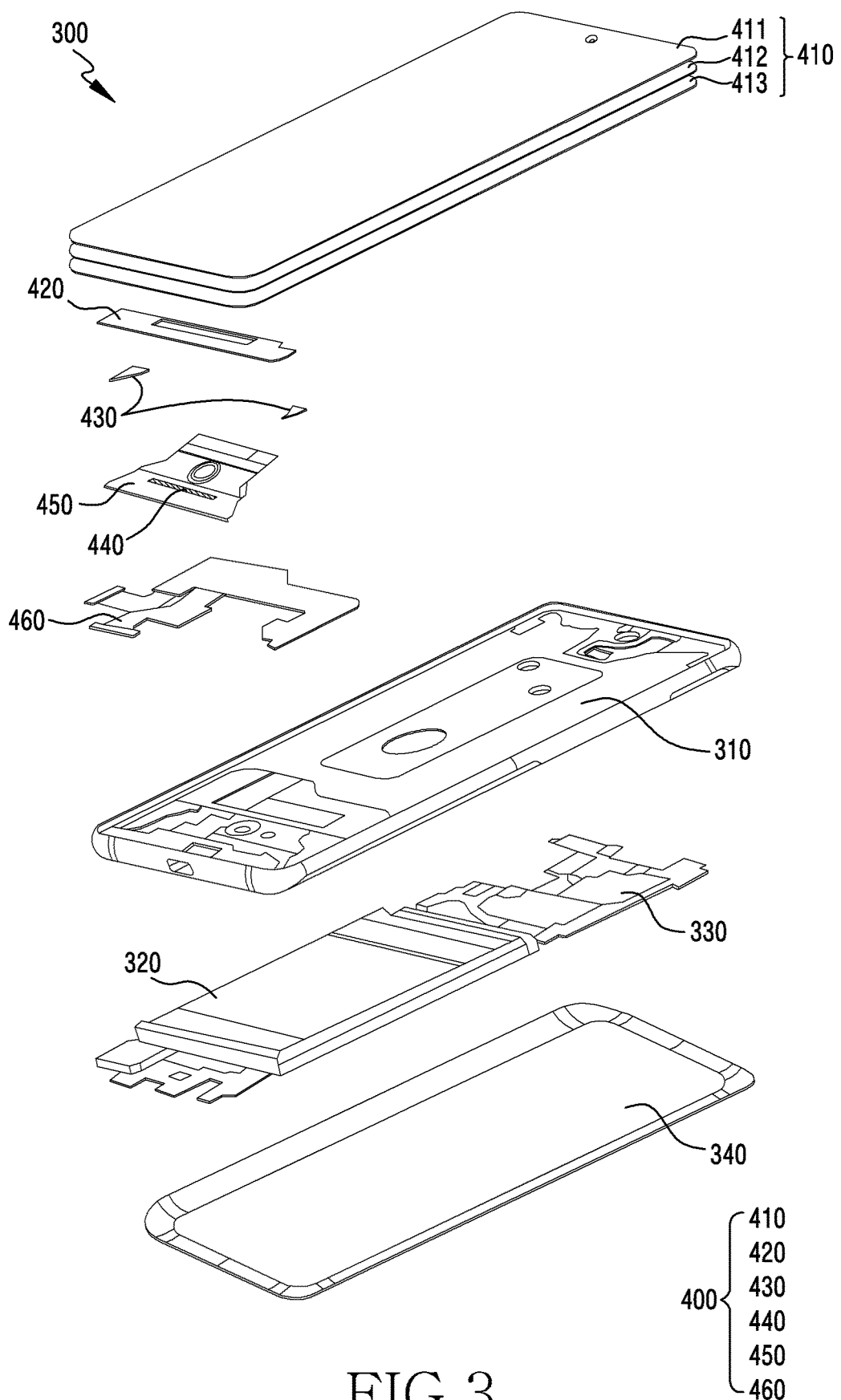
FIG. 3 is an exploded perspective view of the electronic device according to an embodiment of the disclosure.

FIG. 3 is an exploded perspective view of an electronic device according to an embodiment of the disclosure.

Referring to FIG. 3, an electronic device 300 (e.g., the electronic device 200 of FIGS. 2A and 2B) according to an embodiment may include a display module 400 (e.g., the display 201 of FIG. 2A), a front housing 310 (e.g., the side surface member 218 of FIGS. 2A and 2B), a battery 320, a main printed circuit board (PCB) 330, and/or a rear surface plate 340 (e.g., the rear surface plate 211 of FIGS. 2A and 2B). The display module 400 according to an embodiment may include an on-cell-touch AMOLED (OCTA) module 410, a first support member 420, second support members 430, a display driver IC (DDI) (or a display driving circuit) 440, a panel flexible circuit film 450, and/or a flexible printed circuit board (FPCB) 460. At least one of the components of the electronic device 300 according to an embodiment may be the same as or similar to at least one of the components of the electronic device 101 of FIG. 1 and/or the electronic device 200 of FIGS. 2A and 2B, and redundant descriptions thereof will be omitted below.

According to an embodiment, the on-cell-touch AMO-LED (OCTA) module 410 may be a touch screen panel (TSP) in which touch sensor electrodes are directly deposited on an active organic light-emitting diode (OLED) display. The OCTA module 410 according to an embodiment may receive a user's touch input. According to an embodiment, the OCTA module 410 may include a transparent plate 411 (e.g., the front surface plate 202 of FIGS. 2A and 2B) configuring at least a portion of the front surface of the electronic device 300, a display panel 412 including light-emitting pixels, and/or a cover panel 413 covering the rear surface of the display panel. According to an embodiment, four corners of the edges of the OCTA module 410 may have a round shape or a chamfered shape.

According to an embodiment, the display panel of the OCTA module is configured to display an image and may include an OLED in which an organic light-emitting material may be disposed between at least two glasses and/or films. However, in various embodiments of the disclosure, the display panel is not limited to the OLED, and various types of display panels may be used.

According to an embodiment, the first support member 420 may be disposed between the rear surface of the OCTA module 410 and the panel flexible circuit film 450 adjacent to the lower end of the electronic device 300. The first support member 420 according to an embodiment may fill an empty space which occurs between the OCT module 410 and the panel flexible circuit film 450 by the display driver IC 440 and/or a bending portion (not illustrated) of the panel flexible circuit film 450. According to an embodiment, the first support member 420 may be made of a durable material to protect the display driver IC 440.

According to an embodiment, the second support members 430 may each be disposed to cover a portion of the rear surface of the first support member 420. The second support members 430 according to an embodiment may each fill an empty space, which may occur between the panel flexible circuit film 450 and the front housing 310 by the panel flexible circuit film 450. According to an embodiment, the second support members 430 may be made of tape so that it can be bonded to the rear surface of the first support member 420. According to an embodiment, a pair of second support members 430 may be respectively disposed at opposite ends of the first support member 420.

According to an embodiment, the panel flexible circuit film 450 may be disposed adjacent to the lower end portion of the electronic device 300 to cover at least a portion of the rear surface of the OCTA module 410 and may be disposed between the first support member 420 and the front housing 310. According to an embodiment, the panel flexible circuit film 450 may electrically connect the display panel 412 and the FPCB 460 to each other and may include the display driver IC 440 (or a display drive circuit) capable of controlling the display panel 412.

According to an embodiment, the display driver IC 440 may be electrically connected to the panel flexible circuit film 450 and may be disposed between the rear surface of the OCTA module 410 and the panel flexible circuit film 450. According to an embodiment, the display driver IC 440 may receive image information including an image control signal corresponding to a command for controlling image data from the FPCB 460 and/or the main PCB 330 and may control the display panel 412 in response to the received image information to implement an image. For example, the display driver IC 440 may support an operating frequency of 120 Hz.

According to an embodiment, the display driver IC 440 and the panel flexible circuit film 450 may configure a chip-on-film (COF) that controls the display module 400 (or the display panel 412).

According to an embodiment, the FPCB 460 may be disposed adjacent to the lower end portion of the electronic device 300 to cover at least a portion of the rear surface of the OCTA module 410 and/or at least a portion of the rear surface of the panel flexible circuit film 450. According to an embodiment, the FPCB 460 may be electrically connected to the main PCB 330 of the electronic device 300, and a plurality of electronic components (e.g., a processor, a memory, and an interface) may be disposed on the FPCB 460.

According to an embodiment, the front housing 310 may define at least a portion of the exterior of the electronic device 300 and may include a seating portion to be used to place various electronic components (e.g., the battery 320 and the main PCB 330) thereon.

According to an embodiment, the battery 320 may be disposed inside the front housing 310. The battery 320 is a device for supplying power to at least one electronic component of the electronic device 300, and may include, for example, a non-rechargeable primary battery, a rechargeable secondary battery, or a fuel cell. At least a portion of the battery 320 may be disposed substantially on the same plane as, for example, the main PCB 330. According to an embodiment, the battery 320 may be integrally disposed within the electronic device 300, or may be removably mounted on the electronic device 300.

According to an embodiment, the main PCB 330 may be accommodated and disposed inside the front housing 310. According to an embodiment, a plurality of electronic components (e.g., a processor, a memory, and an interface) may be disposed on the main PCB 330. The processor may include at least one of, for example, a central processor, an application processor, a graphics processor, an image signal processor, a sensor hub processor, or a communication processor. The memory may include, for example, volatile memory or nonvolatile memory. The interface may include, for example, a high-definition multimedia interface (HDMI), a universal serial bus (USB) interface, an SD card interface, and/or an audio interface. The interface may electrically or physically connect, for example, the electronic device 200 to an external electronic device and may include a USB connector, an SD card/an MMC connector, or an audio connector.

According to an embodiment, the rear surface plate 340 may define the rear surface (e.g., the second surface 210B of FIG. 2B) of the electronic device 300. The rear surface plate 340 may protect the internal components of the electronic device 300 from an external impact or inflow of foreign substances.

Figure 4A:
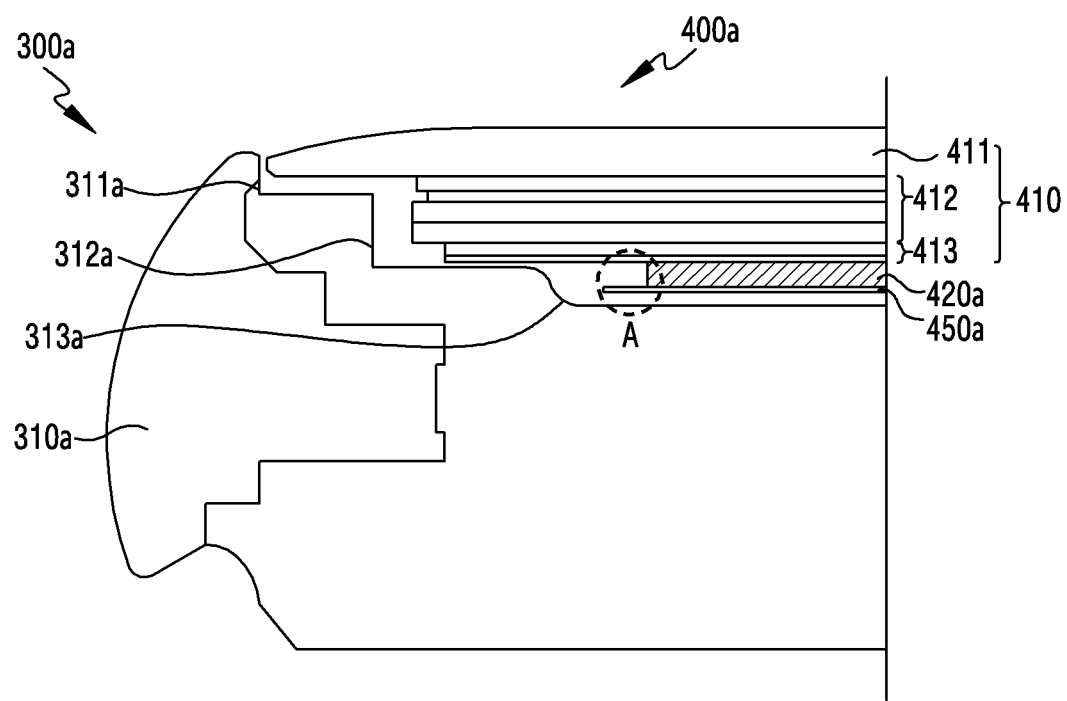
FIGS. 4A, 4B, and 4C are cross-sectional views illustrating, in comparison, internal arrangement structures of an electronic device according to a comparative embodiment and electronic devices according to various embodiments of the disclosure.
Figure 4B:
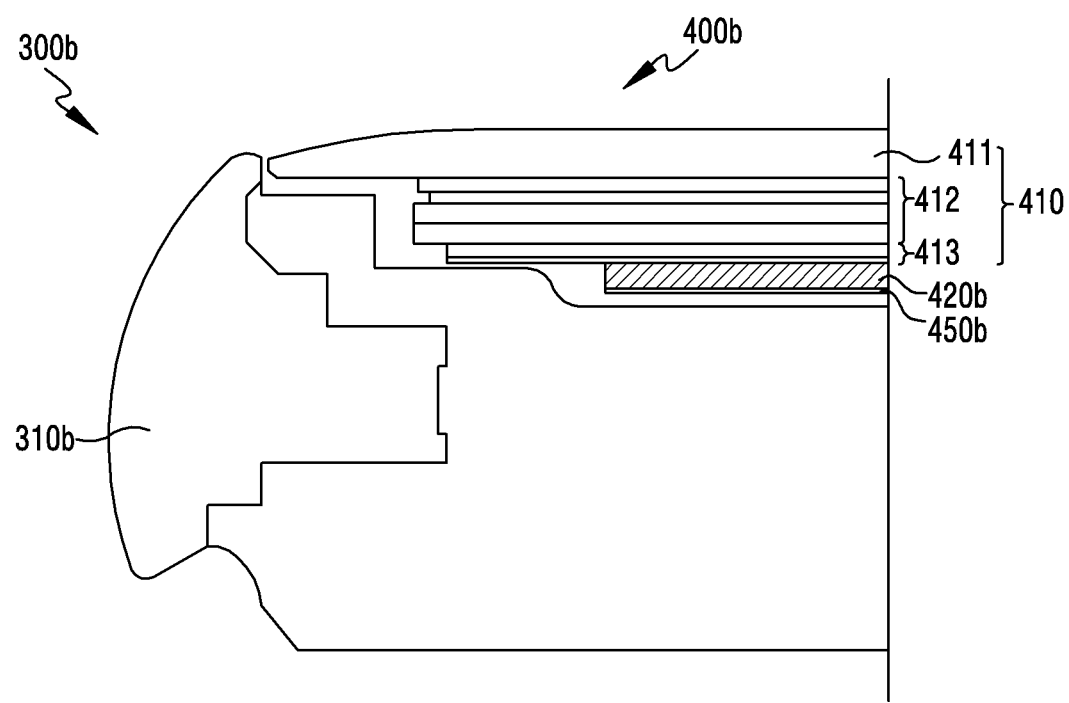
Figure 4C:
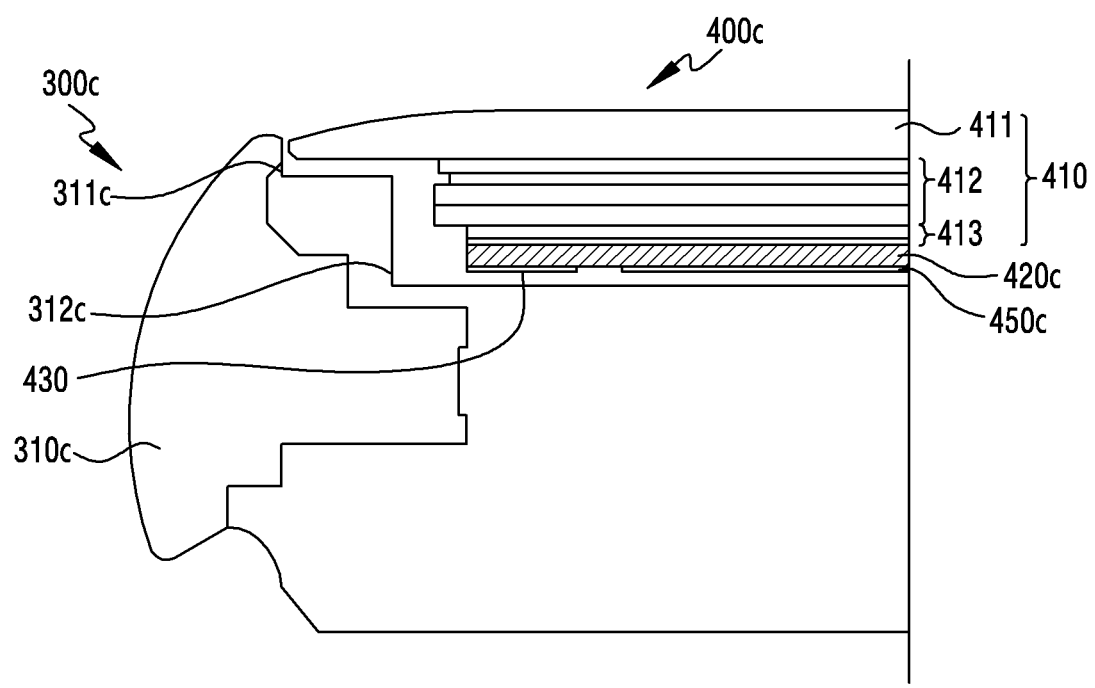

FIGS. 4A, 4B, and 4C are cross-sectional views illustrating, in comparison, internal arrangement structures of an electronic device according to a comparative embodiment and electronic devices according to various embodiments of the disclosure.

FIG. 4A illustrates a display module 400a and a front housing 310a in an electronic device 300a according to a comparative embodiment, FIG. 4B illustrates a display module 400b and a front housing 310b in an electronic device 300b according to an embodiment of the disclosure, and FIG. 4C illustrates a display module 400c and a front housing 310c in an electronic device 300c according to an embodiment of the disclosure. For example, the display module 400a of FIG. 4A and the display module 400b of FIG. 4B may use a display driver IC that supports an operating frequency of 60 Hz, and the display module 400c of FIG. 4C may use a display driver IC that supports an operating frequency of 120 Hz.

Referring to FIG. 4A, in the electronic device 300a according to the comparative embodiment, a first support member 420a disposed between a panel flexible circuit film 450a and the cover panel 413 of the OCTA module 410 may be disposed not to be exposed outside the panel flexible circuit film 450a. That is, the first support member 420a may be disposed not to extend to the end of the cover panel 413. Accordingly, an empty space A inevitably occurs between the panel flexible circuit film 450a and the cover panel 413.

In addition, in the electronic device 300a according to the comparative embodiment, the front housing 310a may include three steps 311a, 312a, and 313a configured to accommodate the display module 400a. For example, the front housing 310a of FIG. 4A may include a first step 311a on which the transparent plate 411 is seated, a second step 312a on which the display panel 412 and the cover panel 413 are seated, and a third step 313a on which the first support member 420a and the panel flexible circuit film 450a are seated. For example, the front housing 310a of FIG. 4A may include the first step 311a providing a space configured to accommodate the transparent plate 411, the second step 312a providing a space configured to accommodate the display panel 412 and the cover panel 413, and the third step 313a providing a space configured to accommodate the first support member 420a and the panel flexible circuit film 450a.

Referring to FIG. 4B, in the electronic device 300b according to an embodiment of the disclosure, a first support member 420b disposed between a panel flexible circuit film 450b and the cover panel 413 of the OCTA module 410 may be disposed to extend to an end of the panel flexible circuit film 450b. For example, the first support member 420b may be disposed to extend to the end of the panel flexible circuit film 450b, but not be exposed outside the panel flexible circuit film 450b. Accordingly, an empty space may not occur between the panel flexible circuit film 450b and the cover panel 413.

According to an embodiment, the front housing 310b in the electronic device 300b of FIG. 4B may be the same as the front housing 310a (e.g., the front housing 310a including three steps 311a, 312a, and 313a configured to accommodate the display module 400a) in the electronic device 300a of FIG. 4A.

Referring to FIG. 4C, in the electronic device 300c according to an embodiment of the disclosure, a first support member 420c disposed between a panel flexible circuit film 450c and the cover panel 413 of the OCTA module 410 may be disposed to be exposed outside the panel flexible circuit film 450c. That is, the first support member 420c may be disposed to extend (or expand) to the end of the cover panel 413. Accordingly, when compared to FIG. 4A, it may be possible to eliminate the empty space between the panel flexible circuit film 450c and the cover panel 413.

The display module 400c of the electronic device 300c according to an embodiment of the disclosure may further include second support members 430 disposed between the first support member 420c and the front housing 310c. According to an embodiment, the second support members 430 may each cover at least a portion of the rear surface of the first support member 420c that is exposed outside the panel flexible circuit film 450c. According to an embodiment, the second support members 430 may each fill an empty space that may occur between the first support member 420c and the front housing 310c, thereby minimizing empty spaces inside the electronic device 300c.

In addition, referring to FIG. 4C, in the electronic device 300c according to an embodiment of the disclosure, the front housing 310c may include two steps 311c and 312c configured to accommodate the display module 400c. For example, the front housing 310c of FIG. 4C may include a first step 311c on which the transparent plate 411 is seated, and a second step on which the display panel 412, the cover panel 413, the first support member 420c, the second support members 430, and the panel flexible circuit film 450c are seated. For example, the front housing 310c of FIG. 4C may include the first step 311c providing a space configured to accommodate the transparent plate 411, and a second step providing a space configured to accommodate the display panel 412, the cover panel 413, the first support member 420c, the second support members 430, and the panel flexible circuit film 450c. According to an embodiment, in the case of the electronic device 300c according to an embodiment of the disclosure, the number of steps in which the display module 400c is accommodated in the front housing 310c may be reduced compared to the electronic device 300a of FIG. 4.

In the electronic device 300c according to an embodiment of the disclosure, by minimizing empty spaces around the display module 400c inside the electronic device 300c and the number of steps in which the display module 400c is accommodated in the front housing 310c, it is possible to suppress the display module 400c from being damaged by a drop impact of the electronic device 300c.

FIGS. 5A and 5B are plan views illustrating, in comparison, the inner arrangement structures of a display module according to a comparative embodiment (e.g., a display module of FIG. 4A) and a display module (e.g., a display module of FIG. 4C). according to various embodiments of the disclosure FIG. 5A illustrates a panel flexible circuit film 450' and the FPCB 460 in the display module 400' according to the comparative embodiment, and FIG. 5B illustrates a panel flexible circuit film 450 and the FPCB 460 in the display module 400 according to an embodiment of the disclosure. For example, the display module 400' of FIG. 5A may use a display driver IC (not illustrated) that supports an operating frequency of 60 Hz, and the display module 400 of FIG. 5B may use the display driver IC 440 that supports an operating frequency of 120 Hz.

According to an embodiment, the panel flexible circuit films 450' and 450 in FIGS. 5A and 5B may electrically connect the FPCB 460 and the OCTA module 410 to each other.

When comparing FIGS. 5A and 5B, the panel flexible circuit film 450 using the 120 Hz display driver IC 440 according to an embodiment of the disclosure may cover the area of the rear surface of the OCTA module 410 greater than the area of the panel flexible circuit film 450' using a 60 Hz display driver IC according to the comparative embodiment.

Referring to FIG. 5A, the panel flexible circuit film 450' of the display module 400' may not extend to opposite corners of the lower end portion of the OCTA module 410, but may be disposed to cover only the central area of the lower portion of the OCTA module 410. In contrast, in FIG. 5B, the panel flexible circuit film 450 of the display module 400 of the disclosure may be disposed to cover the OCTA module 410 from the center area of the lower end portion of the OCTA module 410 to areas adjacent to opposite corners of the OCTA module 410. According to an embodiment, in the case of the display module 400 using a 120 Hz display driver IC 440, a panel flexible circuit film 450 having an area greater than that of the display module 400' using a 60 Hz display driver IC may be used.

Referring to FIGS. 6, 7, and 8A to 8C, an internal arrangement structure of a display module of an electronic device according to an embodiment of the disclosure will be described in detail.

Figure 6:
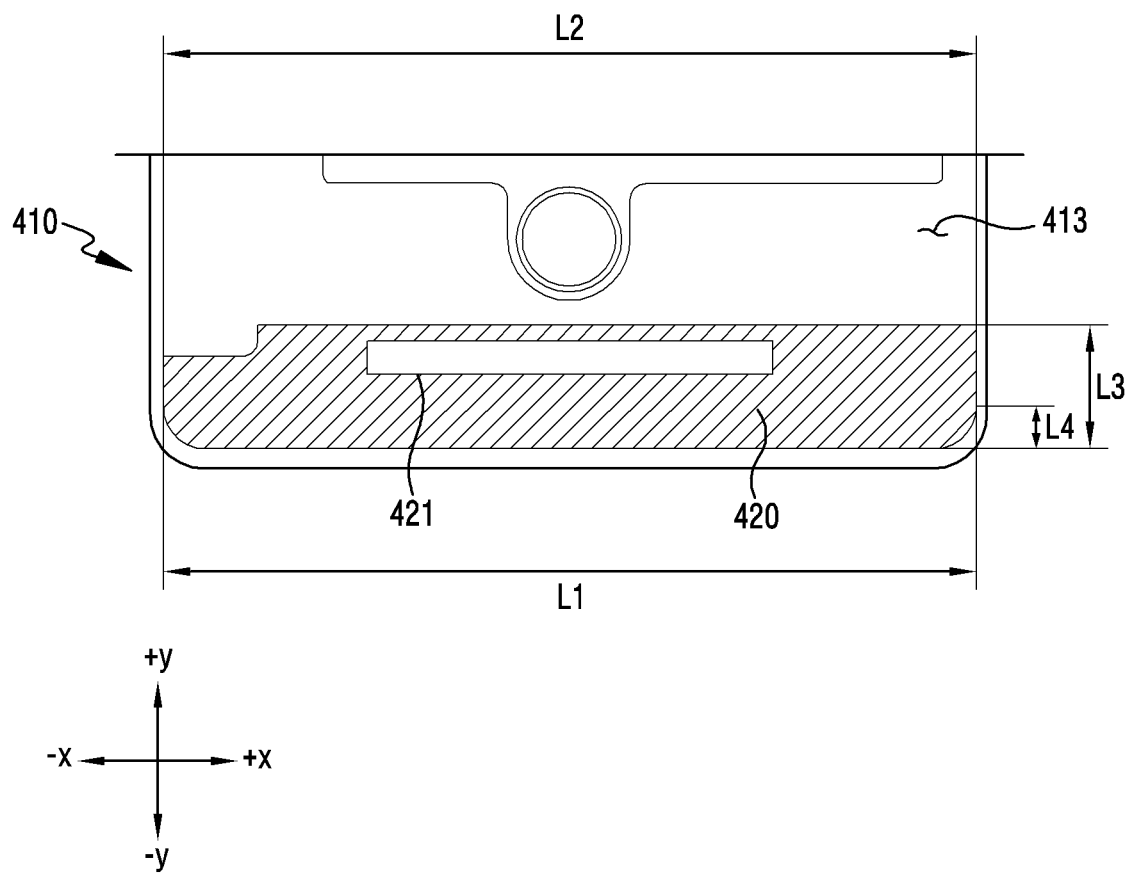
FIG. 6 is a view illustrating a state in which an on-cell-touch active matrix organic light emitting diode (AMOLED) (OCTA) module and a first support member are disposed on the rear surface of a display module according to an embodiment of the disclosure.

FIG. 6 is a view illustrating a state in which an OCTA module and a first support member are disposed on the rear surface of a display module according to an embodiment of the disclosure.

Referring to FIG. 6, the first support member 420 may be disposed adjacent to the lower end portion of the rear surface of the OCTA module 410 (or the cover panel 413 of the OCTA module 410) (e.g., in the −y direction of FIG. 6). According to an embodiment, an opening 421 configured to dispose the display driver IC 440 therein may be included in the first support member 420. The first support member 420 according to an embodiment may be disposed to surround the display driver IC 440 on all sides to protect the display driver IC 440 from an external impact.

According to an embodiment, a length L1 of the first support member 420 in the first direction (e.g., the x-axis direction of FIG. 6) may be equal to a length L2 of the cover panel 413 in the first direction. According to an embodiment, the first support member 420 may cover the entire area of the lower end portion of the rear surface of the cover panel 413 in the first direction. That is, the first support member 420 may be disposed extending from the center of the lower end portion of the cover panel 413 to opposite ends in the first direction.

According to an embodiment, a length L3 of the first support member 420 in the second direction (e.g., the y-axis direction of FIG. 6) may be longer than a height L4 of the round shape of the corners of the cover panel 413. According to an embodiment, the first support member 420 may cover in the second direction the cover panel 413 from the lower end portion (or an area adjacent to the lower end portion) of the rear surface of the cover panel 413 up to an area beyond at least the rounded shapes (or chamfered shapes) of the corners of the cover panel 413. According to an embodiment, the first support member 420 may cover in the second direction the cover panel 413 from the lower end portion (or an area adjacent to the lower end portion) of the rear surface of the cover panel 413 at least up to an area beyond an area in which the display driver IC 440 is disposed.

Figure 7:
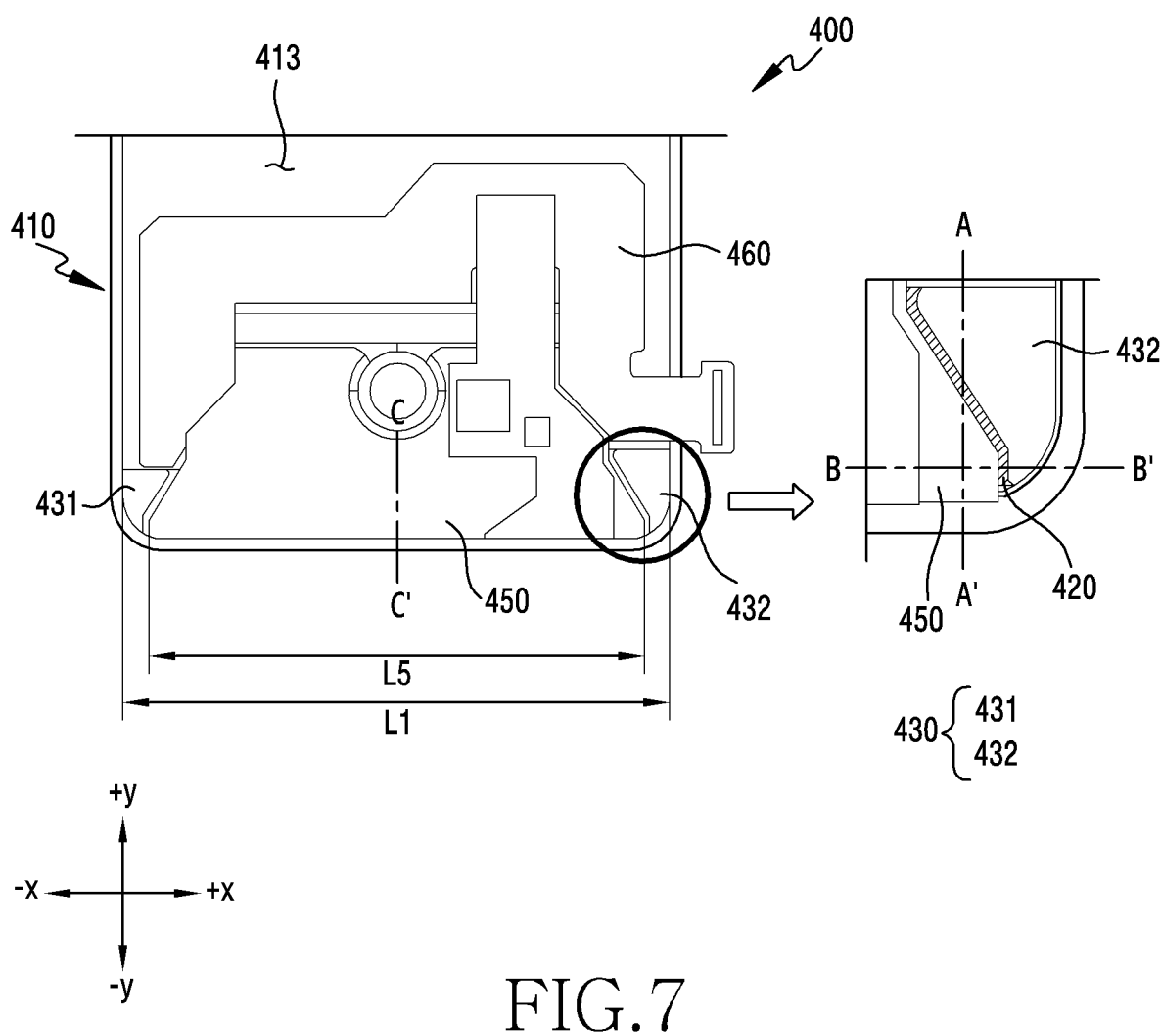
FIG. 7 is a view illustrating a state in which a second support member, a panel flexible circuit film, and an FPCB are disposed on the rear surface of the display module of FIG. 6 according to an embodiment of the disclosure.

FIG. 7 is a view illustrating a state in which the second support members 430, the panel flexible circuit film 450, and the FPCB 460 are disposed on the rear surface of the display module 400 of FIG. 6 according to an embodiment of the disclosure.

Referring to FIG. 7, the panel flexible circuit film 450 may be disposed adjacent to the lower end portion (e.g., the −y direction of FIG. 7) of the rear surface of the OCTA module 410 (or the cover panel 413 of the OCTA module 410). According to an embodiment, the panel flexible circuit film 450 may be disposed to cover at least a partial area of the rear surface of the OCTA module 410 and at least a partial area of the rear surface of the first support member 420. According to an embodiment, the panel flexible circuit film 450 may include the display driver IC 440 configured to control the OCTA module 410, and the display driver IC 440 may be disposed between the rear surface of the OCTA module 410 and the flexible circuit films, that is, within the opening 421 of the first support member 420 disposed on the rear surface of the OCTA module 410.

According to an embodiment, at least the partial area of the first support member 420 may be exposed outside the panel flexible circuit film 450 when the display module 400 is viewed from the rear surface of the display module 400. According to an embodiment, at least the partial area of the first support member 420 may have an area greater than that of the panel flexible circuit film 450 within a predetermined distance from the lower end portion of the display module 400. For example, the length L1 of the first support member 420 in the first direction (e.g., the x-axis direction of FIG. 7) is greater than a longest length L5 of the panel flexible circuit film 450 in the first direction.

According to an embodiment, a pair of second support members 431 and 432 may be disposed to cover opposite ends of the rear surface of the first support member 420, respectively. According to an embodiment, the second support members 431 and 432 may each cover at least the partial area of the first support member 420 exposed outside the panel flexible circuit film 450 (i.e., the area that is not covered by the panel flexible circuit film 450).

According to an embodiment, the FPCB 460 may be disposed adjacent to the lower end portion of the rear surface of the OCTA module 410 (or the cover panel 413 of the OCTA module 410). According to an embodiment, the FPCB 460 may be disposed to cover at least a partial area of the rear surface of the OCTA module 410 and at least a partial area of the rear surface of the panel flexible circuit film 450. According to an embodiment, the FPCB 460 may be electrically connected to the OCTA module 410 (or the display panel 412 of the OCTA module 410) via the panel flexible circuit film 450 and may control the OCTA module 410 via the flexible circuit film (or the display driver IC 440 included in the flexible circuit film).

Figure 8A:
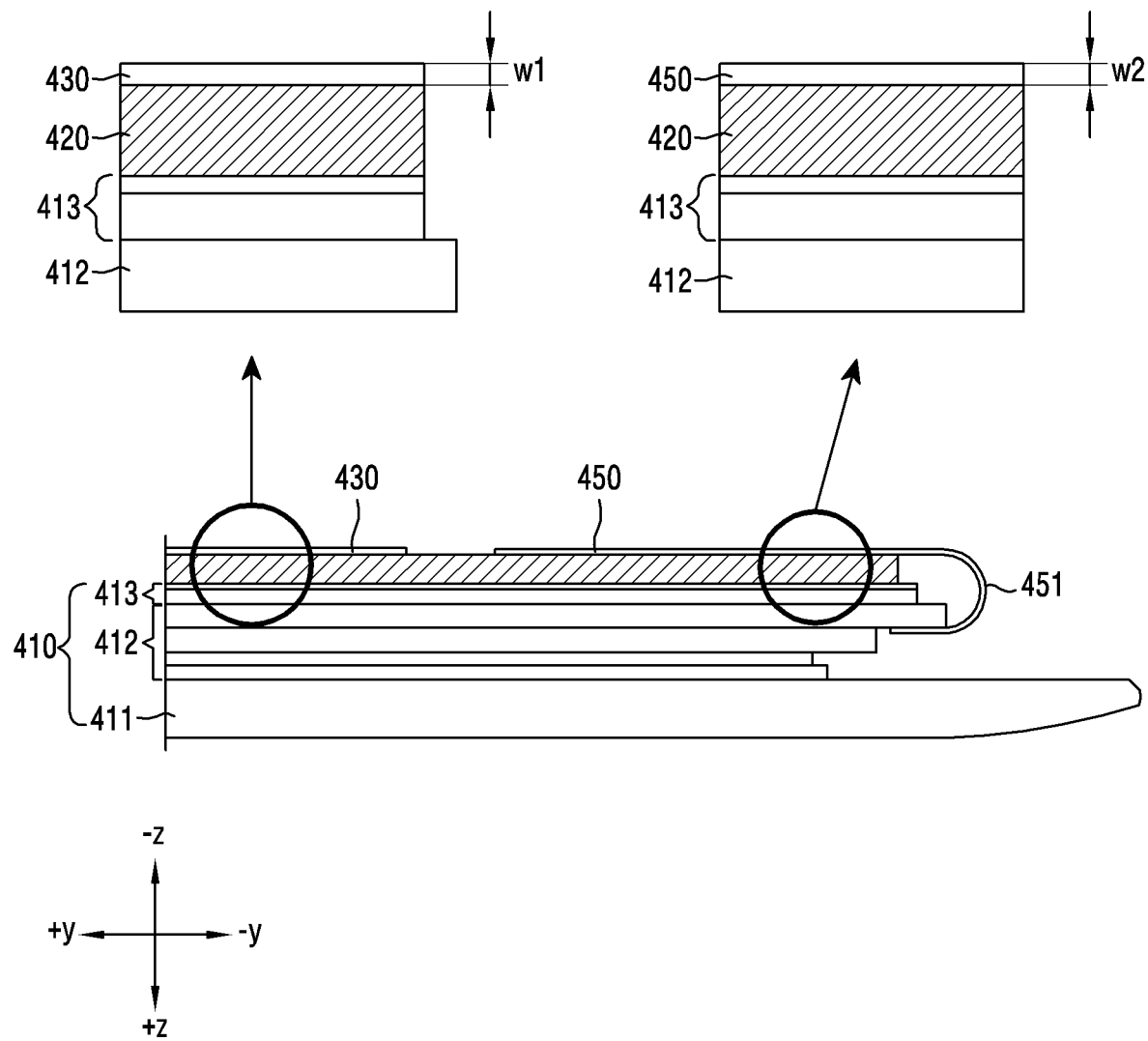
FIG. 8A is a cross-sectional view of the display module of FIG. 7 taken in A-A' direction according to an embodiment of the disclosure.
Figure 8B:
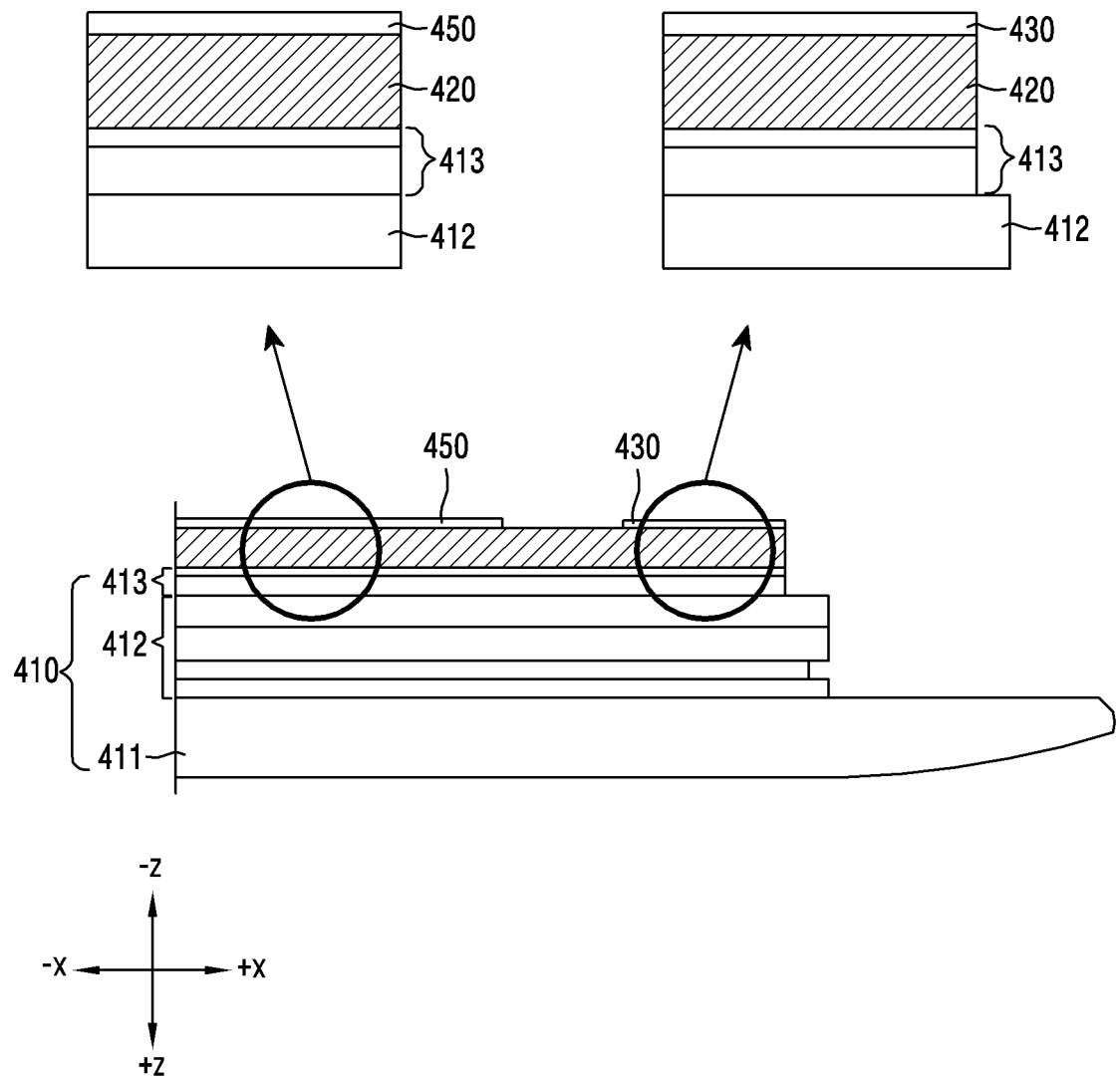
FIG. 8B is a cross-sectional view of the display module of FIG. 7 taken in B-B' direction according to an embodiment of the disclosure.
Figure 8C:
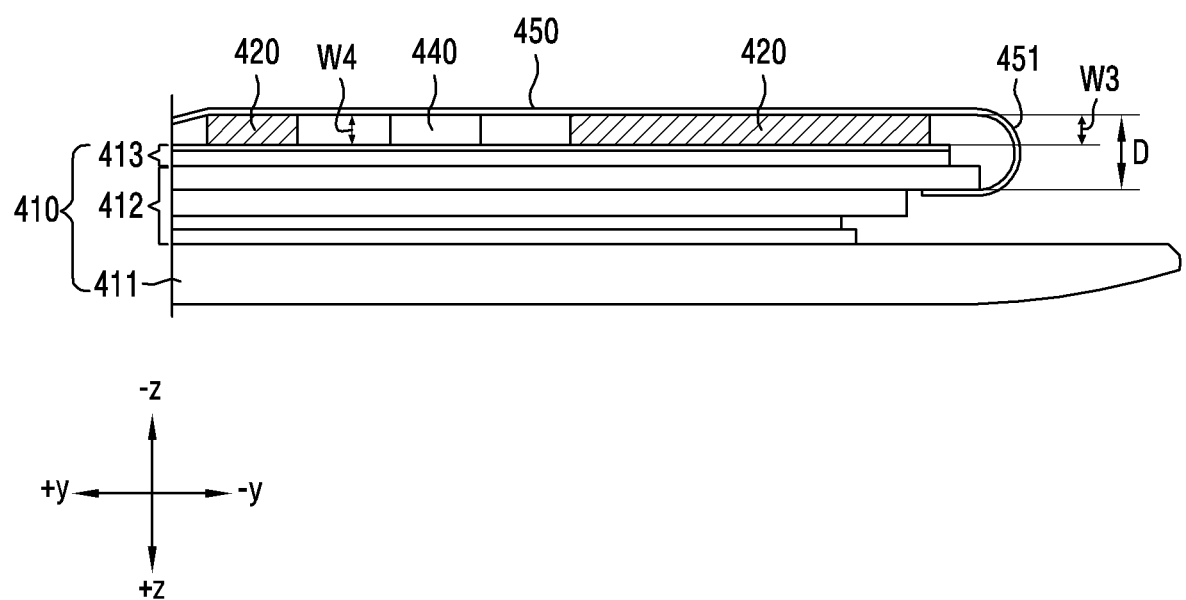
FIG. 8C is a cross-sectional view of the display module of FIG. 7 taken in C-C' direction according to an embodiment of the disclosure.

FIG. 8A is a cross-sectional view of the display module 400 of FIG. 7 taken in A-A' direction according to an embodiment of the disclosure, FIG. 8B is a cross-sectional view of the display module 400 of FIG. 7 taken in B-B' direction according to an embodiment of the disclosure, and FIG. 8C is a cross-sectional view of the display module 400 of FIG. 7 taken in C-C' direction according to an embodiment of the disclosure.

Referring to FIGS. 8A to 8C, the OCTA module 410 may include a transparent plate 411, a display panel 412, and a cover panel 413, and the display panel 412 and the cover panel 413 may be sequentially stacked on the rear surface of the transparent plate 411 (e.g., the surface in the −z direction in FIG. 8A).

According to an embodiment, at least a portion of the display panel 412 may be visually recognized on the front surface (e.g., the surface in the +z-direction surface in FIG. 8A) of the display module 400 (or the electronic device 300) through the transparent plate 411 made of a transparent material. According to an embodiment, the transparent plate 411 may transmit at least one kind of light displayed on the display panel 412 and may protect the display panel 412 from an external physical impact. The transparent plate 411 may be made of at least one of glass and a polymer material such as polycarbonate (PC), polymethyl methacrylate (PMMA), polyimide (PI), polyethylene terephthalate (PET), or polypropylene terephthalate (PPT). According to an embodiment, the transparent plate 411 may include a multilayer structure of various materials.

According to an embodiment, the display panel 412 covering the rear surface of the transparent plate 411 may include a plurality of layers. According to an embodiment, the display panel 412 may include a base substrate, a thin-film transistor (TFT) layer provided on the base substrate, and/or a pixel layer (or organic light-emitting layer) configured to receive a signal voltage from the thin-film transistor layer. The thin-film transistor layer may include an active layer, a gate insulating layer, a gate electrode, an interlayer insulating layer, a source electrode, and/or a drain electrode and may transmit signals necessary for driving the pixel layer. The pixel layer may include a plurality of display elements, for example, light-emitting diodes. The pixel layer may be defined as an area in which a plurality of organic display elements provided on the thin film transistor layer are disposed. According to an embodiment, the display panel 412 may further include a polarization member layer configured to transmit light corresponding to a predetermined direction, a thin-film encapsulation layer configured to encapsulate a pixel layer, and a back film configured to support a base substrate.

According to an embodiment, the cover panel 413 covering the rear surface of the display panel 412 may include a plurality of layers. The cover panel 413 may be disposed under the display panel 412 to protect the display panel 412 and may include various components for facilitating bonding to other components of the display module 400. According to an embodiment, the cover panel 413 may include a black layer (e.g., an embossed layer), a support layer (e.g., a sponge layer), a tape layer, a digitizer and/or a heat dissipation member layer (e.g., a copper (Cu) layer or a graphite layer). The black layer and/or the support layer may absorb an impact to the display panel 412. In addition, the black layer may block light generated from the display panel 412 or light entering from the outside. The digitizer may detect a touch or hovering input made by using a stylus on the display module 400. The heat dissipation member layer may dissipate heat generated from the display panel 412 and may include graphite and/or a copper film.

According to an embodiment, in order to mutually bond the transparent plate 411 and the display panel 412, the display panel 412 and the cover panel 413, and respective layers included in these plates, an adhesive member (or a gluing agent or an adhesive) (not illustrated) may be used. The adhesive member may include, for example, a double-sided adhesive film, a pressure-sensitive adhesive (PSA), an optically clear adhesive (OCA) film, or an optically clear adhesive resin (OCR).

Referring to FIG. 8A, the first support member 420, the panel flexible circuit film 450, and the second support members 430 may be disposed on the rear surface of the cover panel 413. According to an embodiment, the first support member 420 may be disposed between the panel flexible circuit film 450 and the cover panel 413 or between the second support members 430 and the cover panel 413. According to an embodiment, the first support member 420 may fill an empty space which may occur due to a bending portion 451 of the panel flexible circuit film 450 or the display driver IC 440 (see FIG. 8C). The function and shape (e.g., the thickness) of the first support member 420 will be described in detail with reference to FIG. 8C.

According to an embodiment, the panel flexible circuit film 450 may be disposed adjacent to the lower end portion (e.g., the −y direction of FIG. 8A) of the display module 400 (or the electronic device 300) to cover the rear surface of the cover panel 413. According to an embodiment, the panel flexible circuit film 450 may electrically connect the display panel 412 (or at least one layer included in the display panel 412) and the FPCB 460 of the electronic device 300 to each other.

According to an embodiment, the panel flexible circuit film 450 may include a bending portion 451 extending toward the front surface of the display panel 412 in an area adjacent to the lower end portion of the display module 400, and the bending portion 451 may be electrically connected to the display panel 412 on the front surface of the display panel 412. According to an embodiment, the bending portion 451 may extend toward the front surface of at least one layer included in the display panel 412 in an area adjacent to the lower end portion of the display module 400 and may be electrically connected to at least one layer included in the display panel 412 on the front surface of the layer.

According to an embodiment, the second support members 430 may each cover at least a partial area of the rear surface of the first support member 420. According to an embodiment, the second support members 430 may each cover at least a partial area of the first support member 420 exposed outside the panel flexible circuit film 450 or at least a portion of an area not covered by the flexible circuit film in the rear surface of the first support member 420. According to an embodiment, a thickness w1 of the second support members 430 may be equal to a thickness w2 of the flexible circuit film. Accordingly, the second support members 430 may fill empty spaces between the first support member 420 and the front housing 310 which may occur due to the flexible circuit film.

Referring to FIG. 8B, the first support member 420 may cover the entire rear surface (e.g., the surface in the −z direction in FIG. 8B) of the cover panel 413 up to the opposite ends of the rear surface of the cover panel 413 in a first direction (e.g., the x-axis direction of FIG. 8B). That is, the first support member 420 may be disposed extending from the center of the lower end portion of the cover panel 413 to the opposite ends in the first direction. According to an embodiment, the length of the first support member 420 in the first direction may be the same as the length of the cover panel 413 in the first direction, and the opposite ends of the first support member 420 in the first direction may be arranged to match the opposite ends of the cover panel 413 in the first direction.

Referring to FIG. 8C, the first support member 420 may fill an empty space between the panel flexible circuit film 450 and the cover panel 413 and/or an empty space between the second support members 430 and the cover panel 413 that may occur due to the bending portion 451 of the panel flexible circuit film 450 and/or the display driver IC 440. According to an embodiment, a thickness w3 of the first support member 420 may be equal to or greater than a thickness w4 of the display driver IC 440 and may be smaller than the diameter D of the bending portion 451 of the panel flexible circuit film 450. Accordingly, the first support member 420 may compensate for an empty space that may occur due to the bending portion 451 of the panel flexible circuit film 450 and/or the display driver IC 440.

Figure 9:
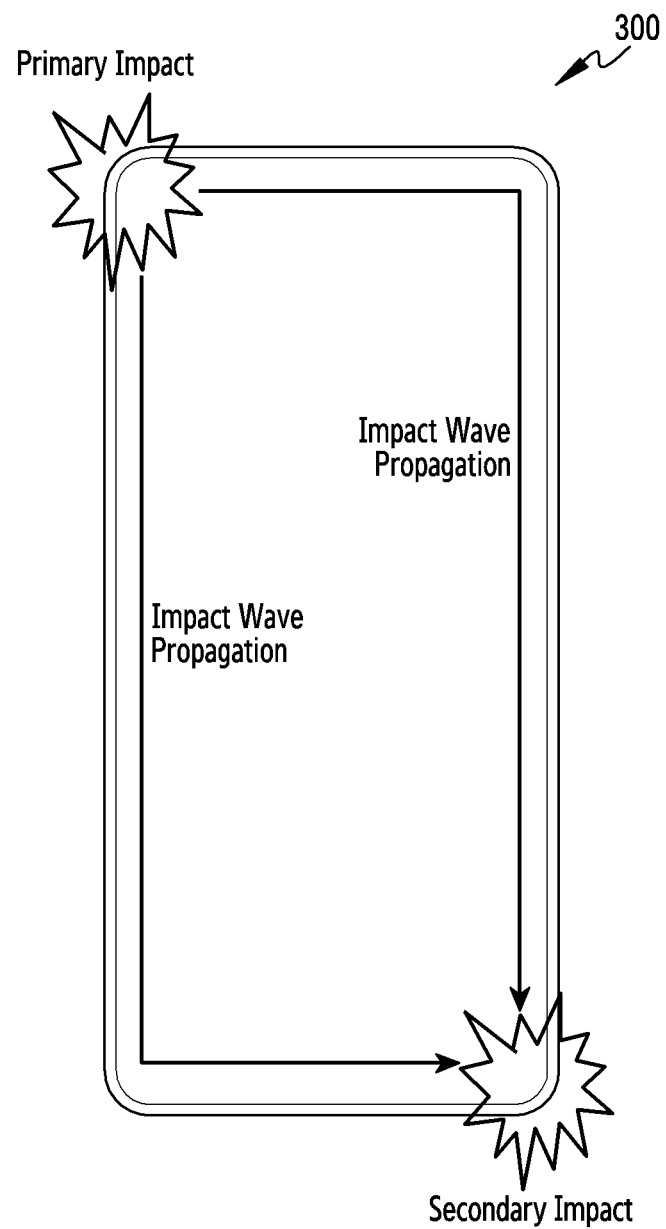
FIG. 9 is a view illustrating impacts according to drop of an electronic device according to an embodiment of the disclosure.

FIG. 9 is a view illustrating impacts according to drop of an electronic device according to an embodiment of the disclosure.

Damage caused by impact when the electronic device 300 is dropped may occur mainly in the thin-film encapsulation layer of the display panel 412 of the OCTA module 410, and when there is an empty space around the thin-film encapsulation layer, the impact caused by the drop have a greater effect. Referring to FIG. 9, when the electronic device 300 is dropped, the horizontal/vertical progression of waves caused by a primary impact meets at the point of a secondary impact, so a greater impact may be delivered to the thin-film encapsulation layer of the OCTA module 410.

According to an embodiment, since the panel flexible circuit film 450 extending to the corners of the OCTA module 410 is used in the display module 400 in which the display driver IC 440 supporting an operating frequency of 120 Hz is embedded, an empty space around the thin-film encapsulation layer of the display panel 412 may come close to a corner of the OCTA module 410, which may be in disadvantageous in terms of damage to the electronic device 300 due to a drop. Accordingly, in the case of the display module 400 of the electronic device 300 according to an embodiment of the disclosure, in order to suppress damage due to a drop, the area of the first support member 420 may be extended to corners of the OCTA module 410, and the second support members 430 may be additionally disposed so that the empty spaces inside the electronic device 300 can be reduced.

Figure 10:
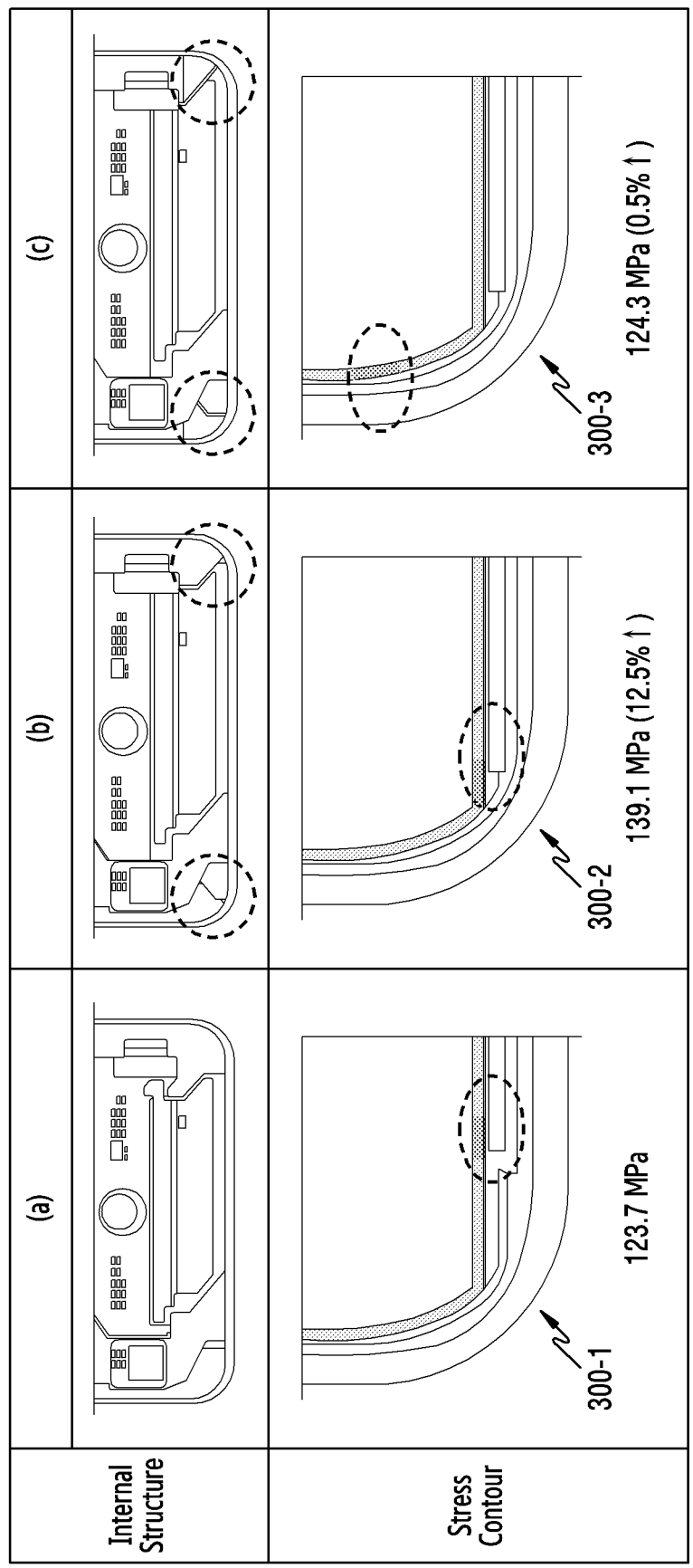
FIG. 10 is a table showing, in comparison, impact distributions (or stress contours) due to the secondary impacts of falling of FIG. 9 in a drop simulation of electronic devices according to an embodiment of the disclosure.

FIG. 10 is a table showing, in comparison, impact distributions (or stress contours) due to the secondary impacts of falling of FIG. 9 in a drop simulation of electronic devices according to an embodiment of the disclosure.

Part (a) of FIG. 10 shows an electronic device 300-1 including a display module (e.g., the display module 400' of FIG. 5A) in which a 60 Hz display driver IC and a small-area panel flexible circuit film are embedded, part (b) of FIG. 10 shows an electronic device 300-2 including a display module in which a large-area panel flexible circuit film 450 is embedded as a 120 Hz display driver IC 440 is used, and part (c) of FIG. 10 shows an electronic device 300-3 according to an embodiment of the disclosure in which the area of the first support member 420 is increased and the second support members 430 are additionally disposed in the electronic device of part (b) of FIG. 10. The electronic device 300-1 of part (a) of FIG. 10 may correspond to the electronic device 300*a* of FIG. 4A, and the electronic device 300-3 of part (c) of FIG. 10 may correspond to the electronic device 300*c* of FIG. 4C.

Referring to FIG. 10, in the case of the electronic device 300-2 of part (b) of FIG. 10 including the display module in which the 120 Hz display driver IC 440 and the large-area panel flexible circuit film 450 are embedded, the impact caused by a drop is increased by 12.5% compared to the electronic device 300-1 of part (a) of FIG. 10. However, in the electronic device 300-3 of part (c) of FIG. 10 according to an embodiment of the disclosure (i.e., the electronic device 300-3 in which the area of the first support member 420 is increased and the second support members 430 are additionally disposed in the electronic device 300-2 of part (b) of FIG. 10), it is possible to achieve an improvement in terms of the impact by a drop compared to the electronic device 300-2 of part (b) of FIG. 12 since the impact caused by a drop is increased 0.5% compared to the electronic device 300-1 of part (a) of FIG. 10.

Figure 11A:
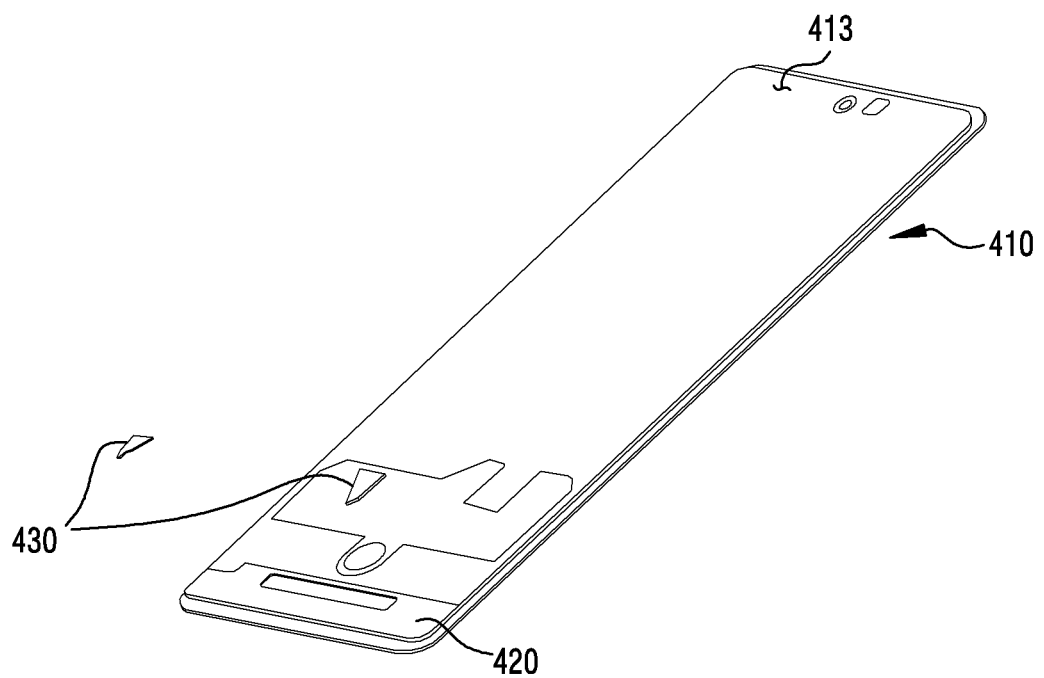
FIG. 11A is a view illustrating assembling a first support member and the second support members to an OCTA module according to an embodiment of the disclosure.
Figure 11B:
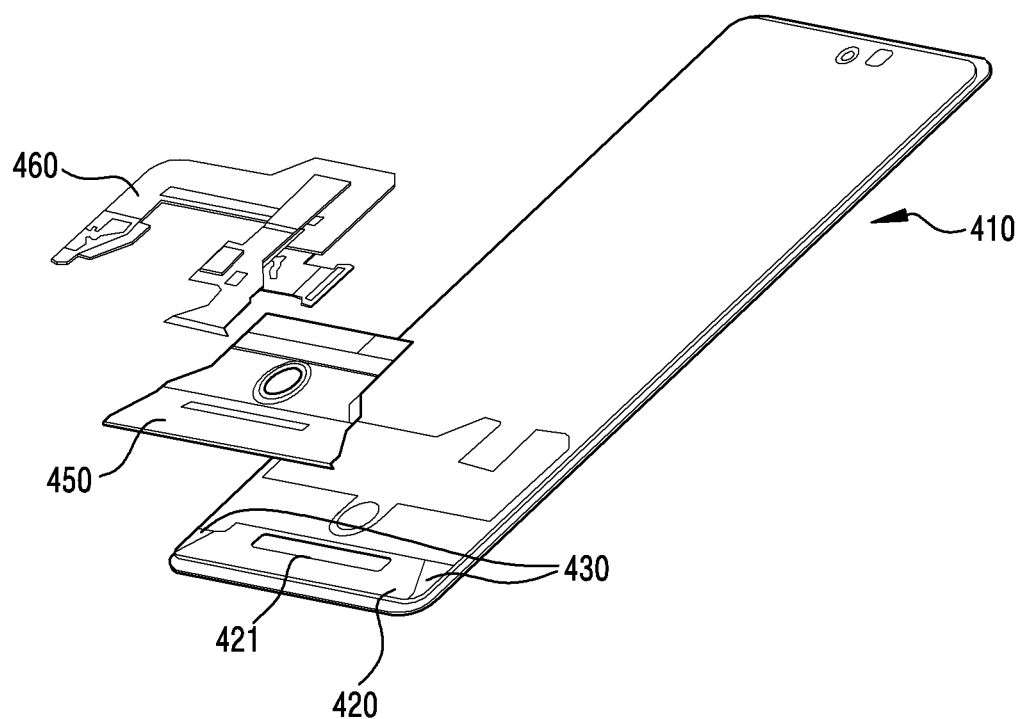
FIG. 11B is a view illustrating assembling a panel flexible circuit film and an FPCB to the display module of FIG. 11A according to an embodiment of the disclosure.
Figure 11C:
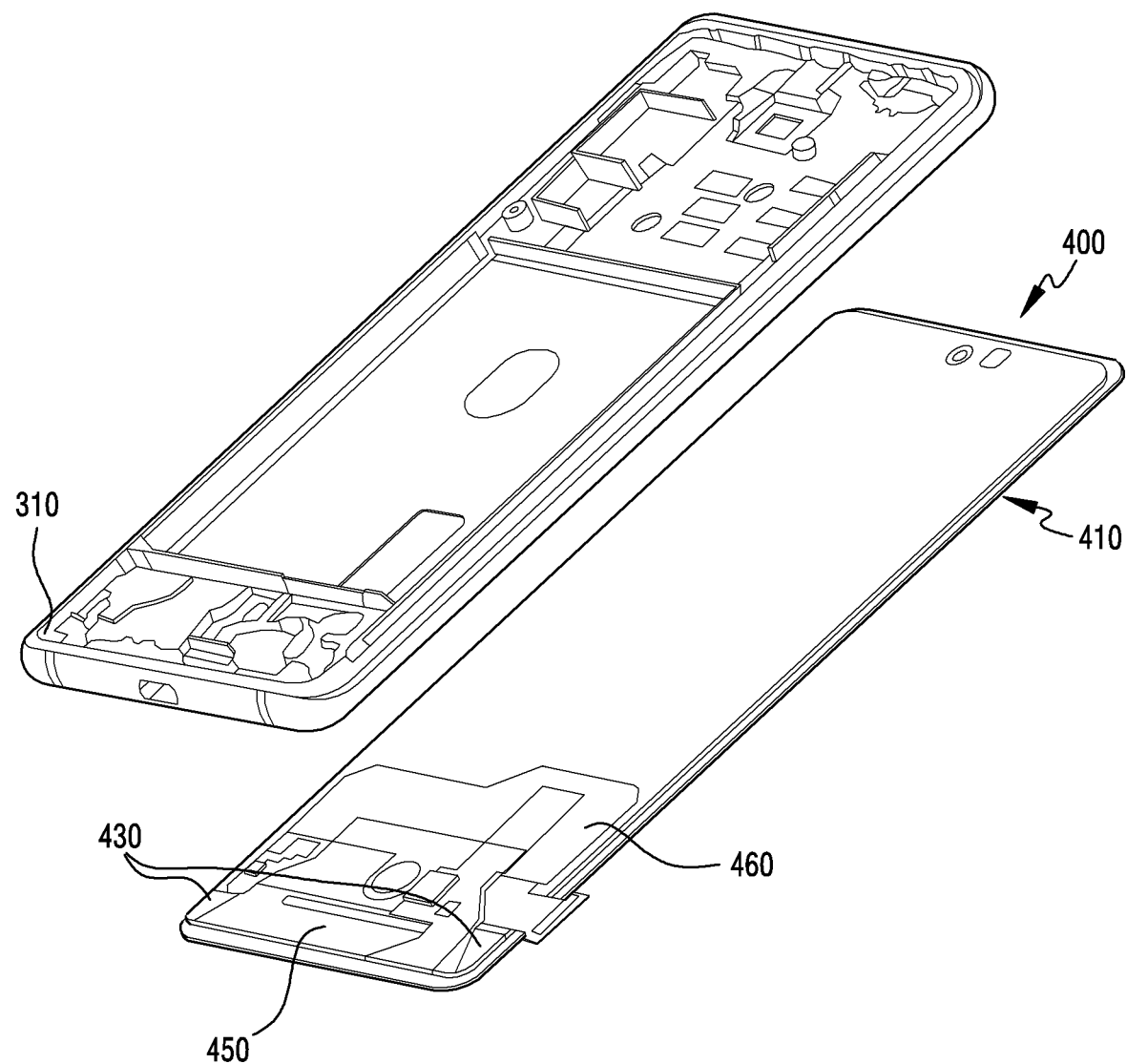
FIG. 11C is a view illustrating assembling a front housing to the display module of FIG. 11B according to an embodiment of the disclosure.

FIGS. 11A, 11B, and 11C are diagrams illustrating a process of assembling a display module of the electronic device according to various embodiments of the disclosure.

FIG. 11A is a view illustrating assembling the first support member 420 and the second support members 430 to the OCTA module 410 according to an embodiment, FIG. 11B is a view illustrating assembling the panel flexible circuit film 450 and the FPCB 460 to the display module 400 of FIG. 11A according to an embodiment, and FIG. 11C is a view illustrating assembling the front housing 310 to the display module 400 of FIG. 11B according to an embodiment.

Referring to FIG. 11A, the first support member 420 may be assembled adjacent to the lower end portion of the rear surface of the OCTA module 410, that is, the rear surface of the cover panel 413 of the OCTA module 410, and a pair of second support members 430 may be assembled adjacent to opposite ends of the rear surface of the first support member 420. According to an embodiment, the area of the pair of second support members 430 may be smaller than that of the first support member 420.

Referring to FIG. 11B, the panel flexible circuit film 450 may be assembled over the rear surface of the first support member 420 and the rear surface of the OCTA module 410, and the FPCB 460 may be assembled over the rear surface of the panel flexible circuit film 450 and the rear surface of the OCTA module 410. According to an embodiment, the display driver IC 440 embedded in the panel flexible circuit film 450 may be disposed to be accommodated in the opening 421 of the first support member 420. According to an embodiment, the panel flexible circuit film 450 may be disposed not to overlap the second support members 430 (i.e., not to cover the second support members 430).

Referring to FIG. 11C, the front housing 310 may be assembled to the rear surface of the display module 400. According to an embodiment, the display module 400 may be arranged to be seated on at least one step provided in the front housing 310. According to an embodiment, the second support members 430 may each fill an empty space that occurs between the first support member 420 and the front housing 310 due to the panel flexible circuit film 450.

As described above, an electronic device (e.g., the electronic device 101 of FIG. 1, the electronic device 200 of FIGS. 2A and 2B, or the electronic device 300 of FIG. 3) according to an embodiment may include a housing defining at least a portion of an exterior of the electronic device, and a display module seated on the housing. The display module may include a transparent plate defining at least a portion of the front surface of the electronic device, a display panel at least partially visually recognized from the front surface of the electronic device through the transparent plate, a panel flexible circuit film including a bending portion disposed under the rear surface of the display panel and extending toward the front surface of the display panel in an area adjacent to a first side surface of the electronic device, wherein the bending portion is electrically connected to the display panel on the front surface of the display panel, and a first support member disposed between the rear surface of the display panel and the panel flexible circuit film, wherein at least a partial area of the first support member may have an area larger than the area of the panel flexible circuit film within a predetermined distance from the first side surface.

According to an embodiment, at least the partial area of the first support member may be exposed outside the panel flexible circuit film when the display module is viewed from the rear surface of the display module, and the first support member may have a first length in a first direction that is greater than the longest length of the panel flexible circuit film in the first direction.

According to an embodiment, the display module may further include at least one second support member disposed under the first support member, and the second support member may cover at least the partial area of the first support member exposed outside the panel flexible circuit film.

According to an embodiment, the second support member may have a thickness that is equal to that of the panel flexible circuit film.

According to an embodiment, the display module may further include a cover panel disposed between the rear surface of the display panel and the first support member, and the first support member may be configured to cover a rear surface of the cover panel from one end to another end of the cover panel in a first direction.

According to an embodiment, the display module may further include a cover panel disposed between the rear surface of the display panel and the first support member, and the first support member may have a length in a first direction which is equal to a length of the cover panel in the first direction.

According to an embodiment, the display module may further include a cover panel disposed between the rear surface of the display panel and the first support member, and the corners of the display panel and the cover panel may have a round shape, and the first support member may cover at least the round shape of the cover panel.

According to an embodiment, the bending portion of the panel flexible circuit film may have a diameter greater than the thickness of the first support member.

According to an embodiment, the display module may further include a flexible printed circuit board (FPCB), and the panel flexible circuit film may electrically connect the display panel and the flexible printed circuit board to each other.

According to an embodiment, the display module may further include a display driver IC (DDI) disposed between the rear surface of the display panel and the panel flexible circuit film, the display driver IC may be electrically connected to the panel flexible circuit film to control driving of the display module, and the first support member may include an opening configured to accommodate the display driver IC therein.

According to an embodiment, the display module may further include a display driver IC (DDI) disposed between the rear surface of the display panel and the panel flexible circuit film, and the first support member may have a thickness equal to or greater than a thickness of the display driver IC.

According to an embodiment, the display module may further include a display driver IC (DDI) disposed between the rear surface of the display panel and the panel flexible circuit film, and the panel flexible circuit film and the display driver IC may constitute a chip-on-film (COF).

According to an embodiment, the display driver IC may support an operating frequency of 120 Hz.

According to an embodiment, the housing may include a first step and a second step, and the transparent plate may be seated on the first step, and the display panel, the panel flexible circuit film, and the first support member may be seated on the second step.

According to an embodiment, the first side surface of the electronic device may be a lower end portion of the electronic device.

As described above, a display module (e.g., the display module 160 of FIG. 1, the display 201 in FIGS. 2A and 2B, or the display module 400 in FIG. 3) of an electronic device (e.g., the electronic device 101 of FIG. 1, the electronic device 200 of FIGS. 2A and 2B, or the electronic device 300 of FIG. 3) according to an embodiment may include a display panel, a panel flexible circuit film including a bending portion disposed under the rear surface of the display panel and extending toward the front surface of the display panel in an area adjacent to a first side surface of the electronic device, wherein the bending portion is electrically connected to the display panel on the front surface of the display panel, and a first support member disposed between the rear surface of the display panel and the panel flexible circuit film. At least the partial area of the first support member may be exposed outside the panel flexible circuit film when the display module is viewed from the rear surface of the display module.

According to an embodiment, the display module may further include at least one second support member disposed under the first support member, the second support member may cover at least the partial area of the first support member exposed outside the panel flexible circuit film, and the second support member may have a thickness that is equal to that of the panel flexible circuit film.

According to an embodiment, the display module may further include a cover panel disposed between the rear surface of the display panel and the first support member, and the first support member may be configured to cover a rear surface of the cover panel from one end to another end of the cover panel in a first direction.

According to an embodiment, the bending portion of the panel flexible circuit film may have a diameter greater than the thickness of the first support member.

According to an embodiment, the display module may further include a display driver IC (DDI) disposed between the rear surface of the display panel and the panel flexible circuit film, the display driver IC may be electrically connected to the panel flexible circuit film to control driving of the display module, the first support member may include an opening configured to accommodate the display driver IC therein, and the first support member may have a thickness equal to or greater than a thickness of the display driver IC.

In the above-described specific embodiments of the disclosure, components included in the disclosure have been expressed in singular or plural terms according to the presented specific embodiments. However, the singular or plural expressions are selected appropriately for the situation presented for convenience of description, and the disclosure is not limited to a singular constituent element or plural constituent elements. A constituent element expressed in a plural form may be configured with a singular element, or a constituent element expressed in a singular form may be configured with plural elements.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
    a housing defining at least a portion of an exterior of the electronic device; and
    a display disposed on the housing,
    wherein the display comprises:
        a transparent plate defining at least a portion of a front surface of the electronic device,
        a display panel at least partially visually recognized from the front surface of the electronic device through the transparent plate,
        a panel flexible circuit film comprising a bending portion disposed under a rear surface of the display panel and extending toward a front surface of the display panel in an area adjacent to a first side surface of the electronic device, the bending portion being electrically connected to the display panel on the front surface of the display panel, a first support member disposed between the rear surface of the display panel and the panel flexible circuit film, at least a partial area of the first support member having an area larger than an area of the panel flexible circuit film within a predetermined distance from the first side surface, and a second support member disposed under the rear surface of the display panel, and wherein the second support member has a thickness corresponding to a thickness of the panel flexible circuit film.

2. The electronic device of claim 1, wherein at least the partial area of the first support member is exposed outside the panel flexible circuit film when the display is viewed from the rear surface of the display, and wherein the first support member has a length in a first direction that is greater than a longest length of the panel flexible circuit film in the first direction.

3. The electronic device of claim 2, wherein the second support member covers at least the partial area of the first support member exposed outside the panel flexible circuit film.

4. The electronic device of claim 1, wherein the display further comprises:

a cover panel disposed between the rear surface of the display panel and the first support member, and wherein the first support member covers a rear surface of the cover panel from one end to another end of the cover panel in a first direction.

5. The electronic device of claim 1, wherein the display further comprises:

a cover panel disposed between the rear surface of the display panel and the first support member, and wherein the first support member has a length in a first direction that is equal to a length of the cover panel in the first direction.

6. The electronic device of claim 1, wherein the display further comprises:

a cover panel disposed between the rear surface of the display panel and the first support member, wherein corners of the display panel and the cover panel have a round shape, and wherein the first support member covers at least the round shape of the cover panel.

7. The electronic device of claim 1, wherein the bending portion of the panel flexible circuit film has a diameter greater than a thickness of the first support member.

8. The electronic device of claim 1, wherein the display further comprises:

a flexible printed circuit board (FPCB), and wherein the panel flexible circuit film electrically connects the display panel to the flexible printed circuit board.

9. The electronic device of claim 1, wherein the display further comprises:

a display driver integrated circuit (IC) disposed between the rear surface of the display panel and the panel flexible circuit film, wherein the display driver IC is electrically connected to the panel flexible circuit film and configured to control driving of the display, and wherein the first support member comprises an opening in which the display driver IC is disposed.

10. The electronic device of claim 1, wherein the display further comprises:

a display driver integrated circuit (IC) disposed between the rear surface of the display panel and the panel flexible circuit film, and wherein the first support member has a thickness equal to or greater than a thickness of the display driver IC.

11. The electronic device of claim 1, wherein the display further comprises:

a display driver integrated circuit (IC) disposed between the rear surface of the display panel and the panel flexible circuit film, wherein the panel flexible circuit film and the display driver IC constitute a chip-on-film (COF), and wherein the display driver IC supports an operating frequency of 120 hertz (Hz).

12. The electronic device of claim 1, wherein the housing comprises a first step and a second step, wherein the transparent plate is disposed on the first step, and wherein the display panel, the panel flexible circuit film, and the first support member are disposed on the second step.

13. The electronic device of claim 1, wherein the first side surface of the electronic device is a lower end portion of the electronic device.

14. A display of an electronic device, the display comprising:

a display panel;

a panel flexible circuit film including a bending portion disposed under a rear surface of the display panel and extending toward a front surface of the display panel in an area adjacent to a first side surface of the electronic device, the bending portion being electrically connected to the display panel on the front surface of the display panel;

a first support member disposed between the rear surface of the display panel and the panel flexible circuit film, at least a partial area of the first support member being exposed outside the panel flexible circuit film when the display is viewed from the rear surface of the display; and a second support member at least partially covering the rear surface of the display panel, wherein the second support member has a thickness corresponding to a thickness of the panel flexible circuit film.

* * * * *